(12) United States Patent
Kitagawa

(10) Patent No.: US 8,238,132 B2
(45) Date of Patent: Aug. 7, 2012

(54) SEMICONDUCTOR DEVICE

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 12/591,711

(22) Filed: Nov. 30, 2009

(65) Prior Publication Data

US 2010/0142245 A1 Jun. 10, 2010

(30) Foreign Application Priority Data

Dec. 9, 2008 (JP) ................................. 2008-313615

(51) Int. Cl.
*G11C 5/02* (2006.01)

(52) U.S. Cl. ............................. 365/51; 365/203; 365/148

(58) Field of Classification Search .................... 365/51, 365/203, 148, 149, 171, 210, 145, 189.05, 365/205, 208, 289.09, 201, 207
See application file for complete search history.

(56) References Cited

U.S. PATENT DOCUMENTS

| | | | | |
|---|---|---|---|---|
| 8,017,457 | B2 * | 9/2011 | Kajigaya ........................ | 438/149 |
| 2002/0034092 | A1 * | 3/2002 | Choi et al. ..................... | 365/145 |
| 2002/0036914 | A1 * | 3/2002 | Hayashi ........................ | 365/104 |
| 2002/0075720 | A1 * | 6/2002 | Akita ............................. | 365/149 |
| 2006/0028856 | A1 * | 2/2006 | Ashikaga ....................... | 365/145 |
| 2006/0187734 | A1 * | 8/2006 | Takazawa et al. ............. | 365/229 |
| 2010/0034009 | A1 * | 2/2010 | Lu et al. ........................ | 365/148 |

OTHER PUBLICATIONS

K. Aratani et al., "A Novel Resistance Memory with High Scalability and Nanosecond Switching," Technical Digest IEDM, 2007 IEEE, pp. 783-786, Kanagawa, Japan.

* cited by examiner

*Primary Examiner* — Dang Nguyen
(74) *Attorney, Agent, or Firm* — Rader Fishman & Grauer, PLLC

(57) ABSTRACT

A semiconductor device includes: a memory cell array having a plurality of memory cells arranged in arrays; a plurality of bit lines formed correspondingly to a column arrangement of the memory cells; a plurality of word lines formed correspondingly to a row arrangement of the memory cells; a plate line having one of a configuration in which the first electrodes of the respective memory cells are included in the plate line and a configuration in which the first electrodes are connected to the plate line; a column switch used to connect a selected bit line and a data access line; and a pre-charge portion that performs a pre-charge operation to pre-charge a non-selected bit line not selected by the column switch to potential of the plate line.

7 Claims, 24 Drawing Sheets

WRITE CURRENT MAKING RESISTANCE LOWER

ERASE CURRENT MAKING RESISTANCE HIGHER

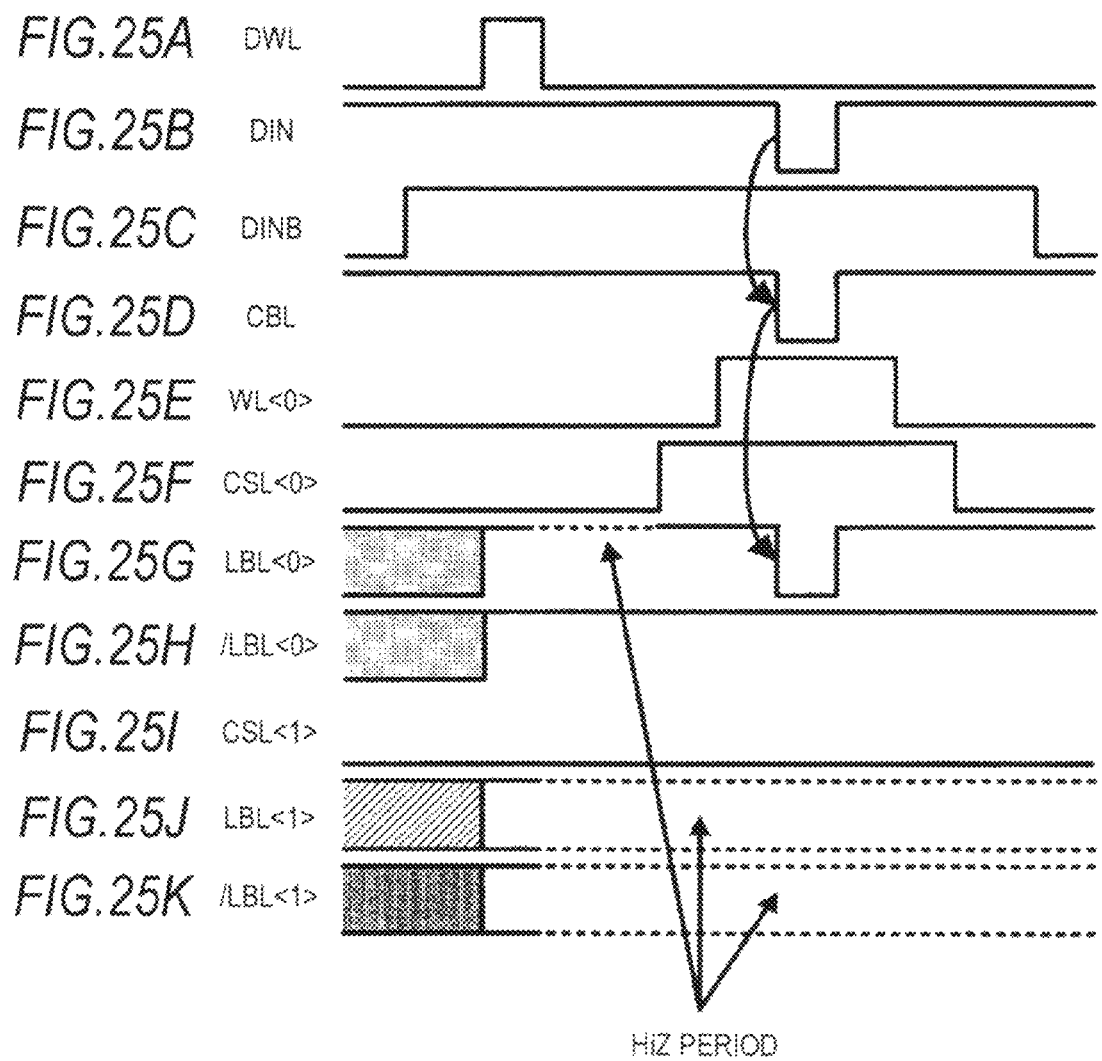

SEMICONDUCTOR DEVICE

BACKGROUND OF THE INVENTION

1. Field of the Invention

The present invention relates to a semiconductor device having a resistance memory element.

2. Description of Related Art

A semiconductor device having a resistance memory element is described, for example, in "A Novel Resistance Memory with High Scalability and Nanosecond Switching", K. Aratani, K. Ohba, T. Mizuguchi, S. Yasuda, T. Shiimoto, T. Tsushima, T. Sone, K. Endo, A. Kouchiyama, S. Sasaki, A. Maesaka, N. Yamada, and H. Narisawa, *Technical Digest* IEDM 2007, pp. 783-786.

Hereinafter, the configuration of a resistance memory cell will be described with reference to the cited reference.

FIG. 1 is a view used to describe the configuration of a resistance memory cell.

As is shown in FIG. 1, one memory cell MC includes one transistor T1 forming a selector resistor and one resistor R1 forming a memory element. In short, one memory cell includes one transistor and one resistor (1T1R).

A resistance layer 13 and an ion source layer 14 are sandwiched between a bottom electrode (fourth metal layer in FIG. 1) 11 and a top electrode 12 and the memory cell MC functions as a memory element depending on whether a conduction path is present in the resistance layer 13. A resistance layer is an insulator, such as $SiO_2$. An ion source layer is a conductive layer containing at least one type of chalcogen element selected from S, Se, and Te and at least one type of metal element selected from Cu, Ag, and Zn. The conduction path is formed so as to contain these metal elements.

The resistor R1 is made low resistance during a write operation and high resistance during an erase operation.

FIG. 2A and FIG. 2B are views showing the potential relation of the resistance memory cell in states where the resistance is made lower (write) and where the resistance is made higher (erase), respectively. FIG. 3A and FIG. 3B are equivalent circuits of the resistance memory cell in states where the resistance is made lower (write) and where the resistance is made higher (erase), respectively. FIG. 4 is a view showing the relation of a write current value and a cell resistance.

As are shown in FIG. 2A and 2B, write and erase operations are switched by changing the current applied polarities. When the resistance memory cell is in a state where the resistance is made lower (write), as is shown in FIG. 2A, 3 V is applied to the top electrode 12 and 0 V is applied to the bottom electrode 11. Accordingly, metal elements ionized within the ion source layer 14 diffuse into the resistance layer 13 and a conduction path is formed, which makes the memory cell low resistance.

When the resistance memory cell is in a state where the resistance is made higher (erase), as is shown in FIG. 2B, 0 V is applied to the top electrode 12 and 1.7 V is applied to the bottom electrode 11. Accordingly, metal elements diffused within the resistance layer 13 return into the ion source layer 14, which makes the memory cell high resistance.

Referring to FIG. 3A and FIG. 3B, directions of a current in states where the resistance is made lower (write) and where the resistance is made higher (erase) are determined by arrows put across the resistors.

Also, as is shown in FIG. 4, resistance of the memory cell varies with a write current value.

The cited reference describes an example where a multi-valued memory is achieved by controlling a write current.

SUMMARY OF THE INVENTION

The following will describe a problem occurring when 0 V is set as the initial value of the plate (PLATE) in a memory cell array having the memory cells described above arranged in arrays by a method of applying write and erase pulses to a selected column alone.

FIG. 5 is a view showing an example of the configuration of the memory cell array. FIG. 6A through FIG. 6H are operating waveform charts of the circuit shown in FIG. 5 during an erase operation.

Let a Cell00 be a memory cell to be selected. Then, in order to apply a pulse to a selected bit line BL alone, a word line WL and a column select signal CSL are activated.

Thereafter, an erase operation is performed by applying a pulse to a bit line BL<0> for a certain period. In this instance, a non-selected bit line BL<1> is in a floating state. However, because the initial bit line BL potential is inconstant, a disturb may possibly occur.

For example, as is shown in FIG. 6H, in a case where the level of the bit line BL<1> is at a power supply voltage VDD, because bit line BL potential is discharged, a discharge current transiently flows into non-selected cells. This operation may possibly cause a disturb.

Herein, the description was given to an erase operation. It should be appreciated, however, that a similar disturb may possibly occur during a write operation, too.

Thus, it is desirable to provide a semiconductor device capable of avoiding a disturb caused by a charge and a discharge of non-selected bit lines during a write operation and an erase operation of a resistance memory cell.

According to an embodiment of the present invention, there is provided a semiconductor device including: a memory cell array having a plurality of memory cells arranged in arrays; a plurality of bit lines formed correspondingly to a column arrangement of the memory cells; a plurality of word lines formed correspondingly to a row arrangement of the memory cells; a plate line having one of a configuration in which first electrodes of the respective memory cells are included in the plate line and a configuration in which the first electrodes are connected to the plate line; a column switch used to connect a selected bit line and a data access line; and a pre-charge portion that performs a pre-charge operation to pre-charge a non-selected bit line not selected by the column switch to potential of the plate line. Each memory cell includes a memory element including a memory layer sandwiched between a first electrode and a second electrode and having a resistance value that varies with an application of a voltage between the first electrode having one of a configuration to be included in the plate line and a configuration to be connected to the plate line and the second electrode, and an access transistor connected between the second electrode and one of the bit lines provided in a corresponding column and having a gate connected to one of the word lines provided in a corresponding row.

According to the embodiment of the present invention, it is possible to avoid a disturb caused by a charge and a discharge of non-selected bit lines during a write operation and an erase operation of a resistance memory cell.

BRIEF DESCRIPTION OF THE DRAWINGS

FIG. 25A through FIG. 25K are operating waveform charts of the circuit shown in FIG. 24 during a write operation.

DESCRIPTION OF THE PREFERRED EMBODIMENTS

Hereinafter, embodiments of the present invention will be described in correlation with the drawings.

Descriptions will be given in the following order.
1. First Embodiment (first example of the configuration of the semiconductor device
2. Second Embodiment (second example of the configuration of the semiconductor device)
3. Third Embodiment (third example of the configuration of the semiconductor device)

1. First Embodiment

Figure 7:
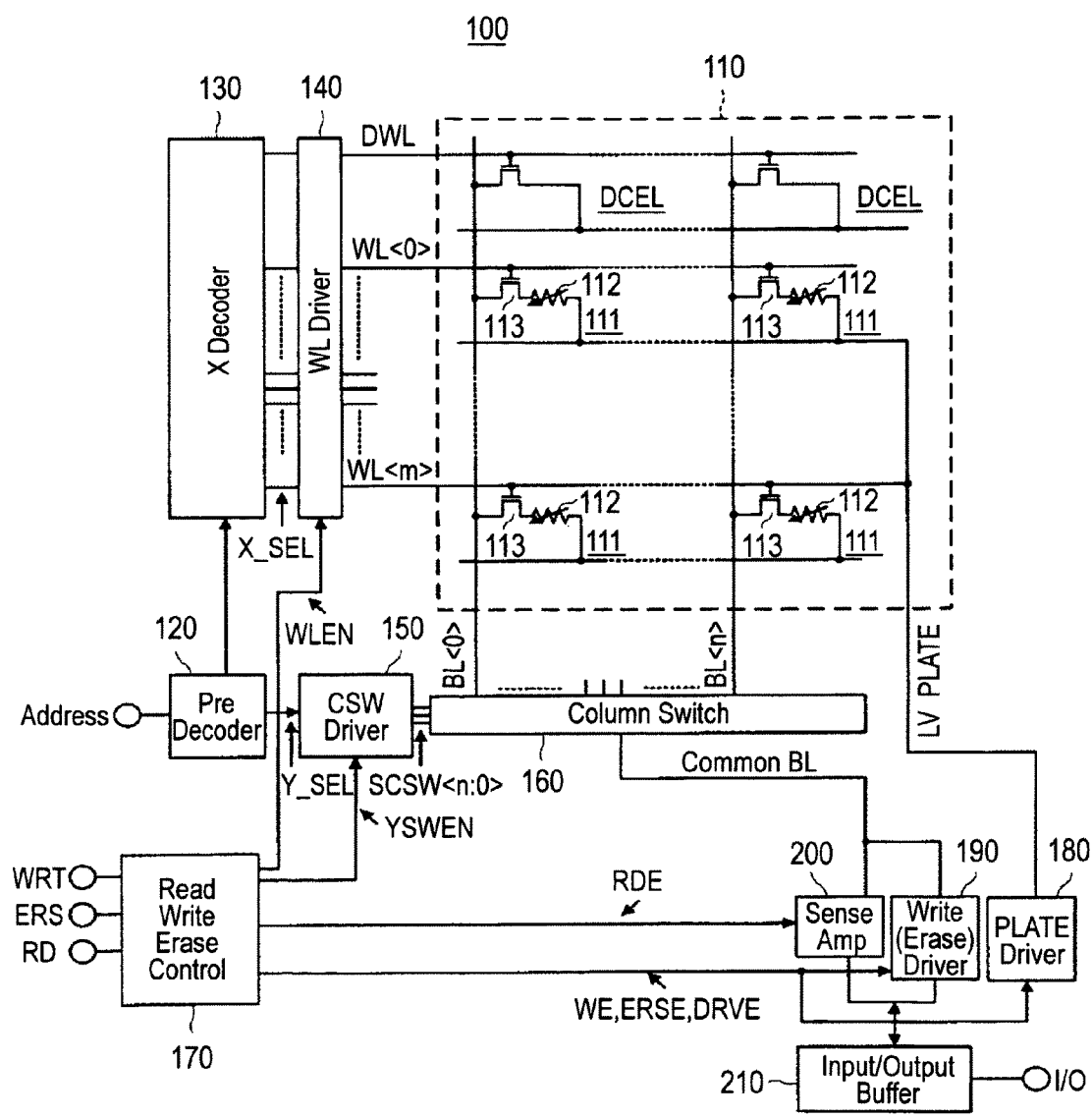
FIG. 7 is a block diagram showing the overall configuration of a semiconductor device according to an embodiment of the present invention.

FIG. 7 is a block diagram showing the overall configuration of a semiconductor device according to an embodiment of the present invention.

As is shown in FIG. 7, a semiconductor device 100 has a memory cell array portion 110, a pre-decoder 120, an X address (row address) decoder 130, a word line driver 140, a column switch (CSW) driver 150, and a column switch 160.

The semiconductor device 100 also has a read, write, and erase control portion (hereinafter, referred to as the control portion) 170, a plate driver 180, a write and erase driver (hereinafter, referred to as the write driver) 190, a sense amplifier 200, and an input/output buffer 210.

Figure 1:
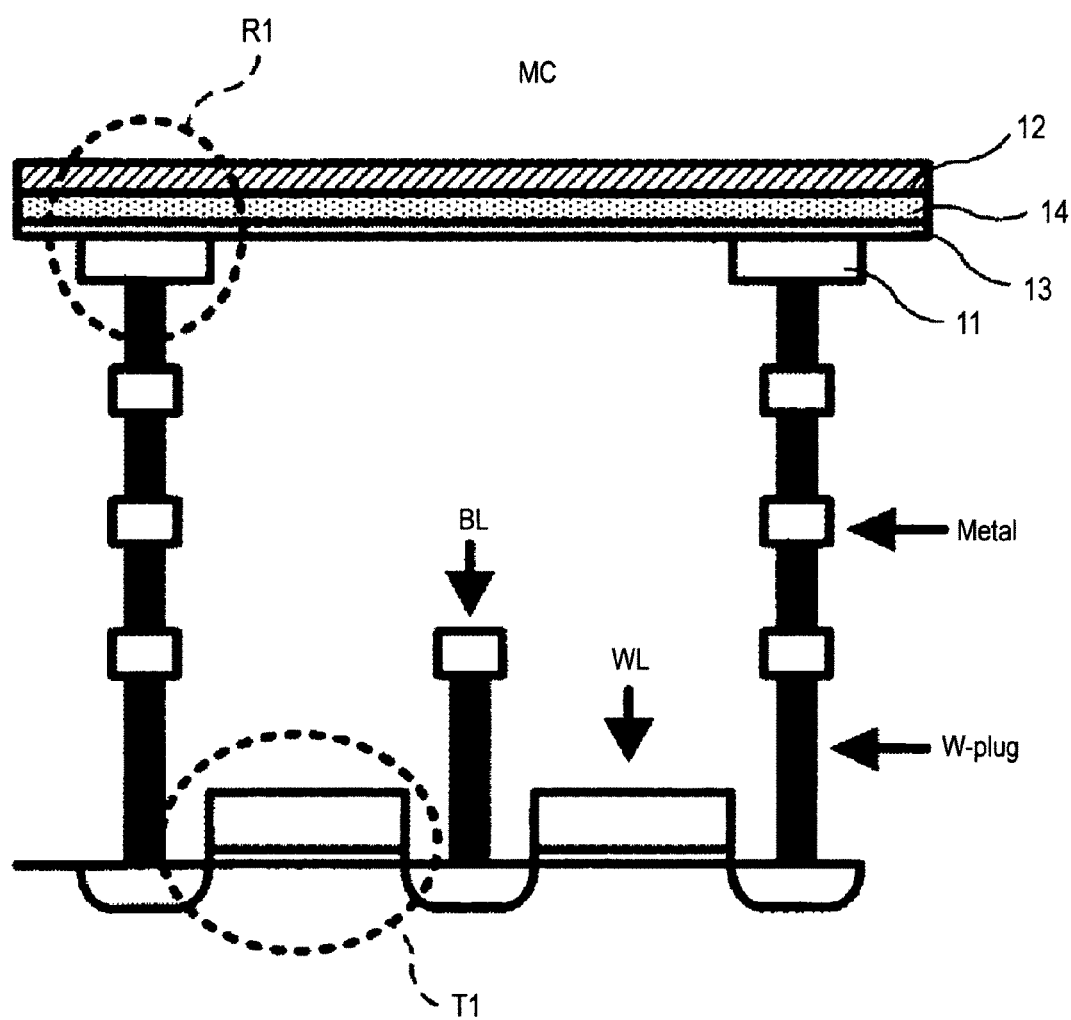
FIG. 1 is a view used to describe the configuration of a resistance memory cell.
Figure 2A:
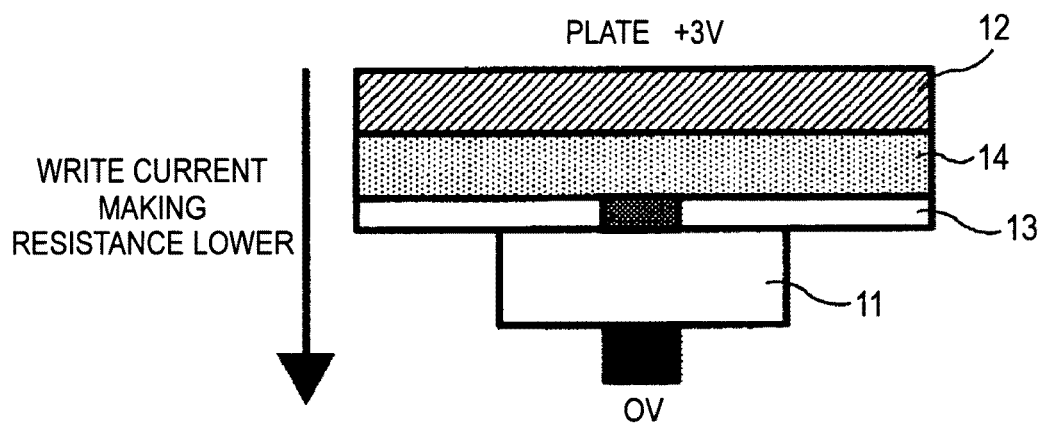
FIG. 2A and FIG. 2B are views showing the potential relation of the resistance memory cell in states where the resistance is made lower (write) and where the resistance is made higher (erase), respectively.
Figure 2B:
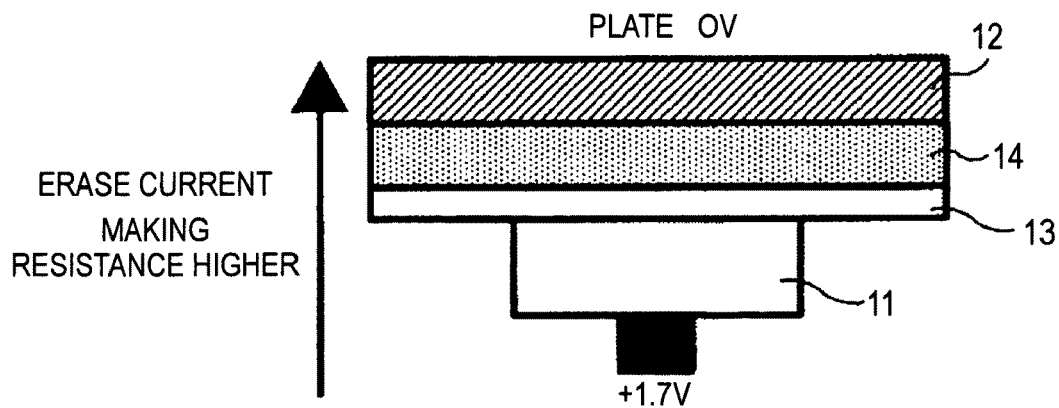
Figure 3A:
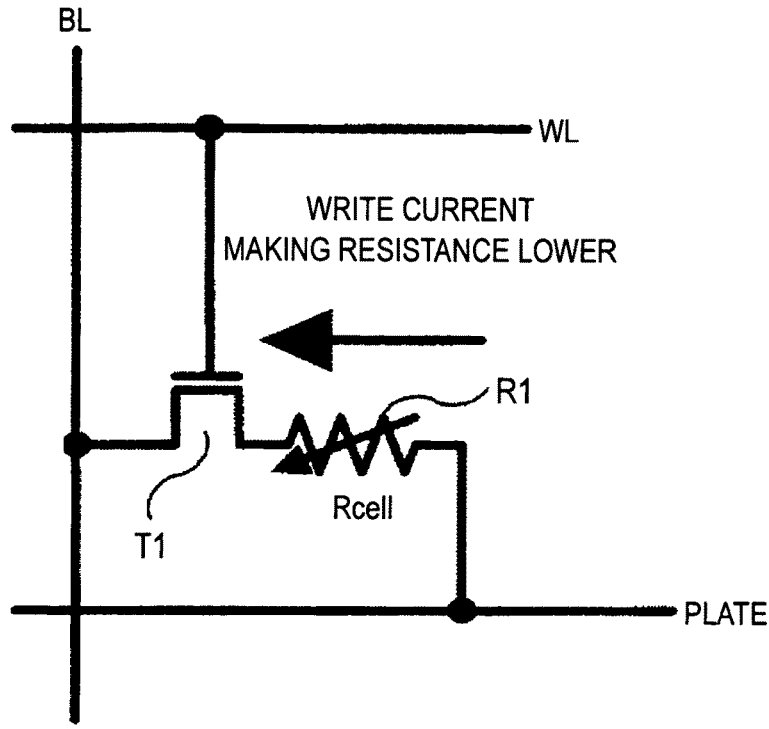
FIG. 3A and FIG. 3B show equivalent circuits of the resistance memory cell in states where the resistance is made lower (write) and where the resistance is made higher (erase), respectively.
Figure 3B:
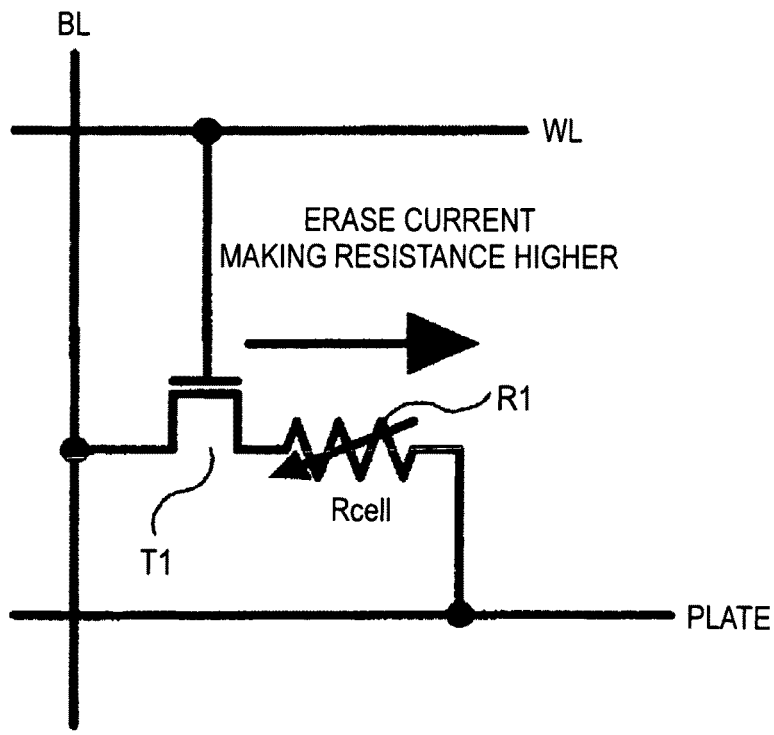
Figure 4:
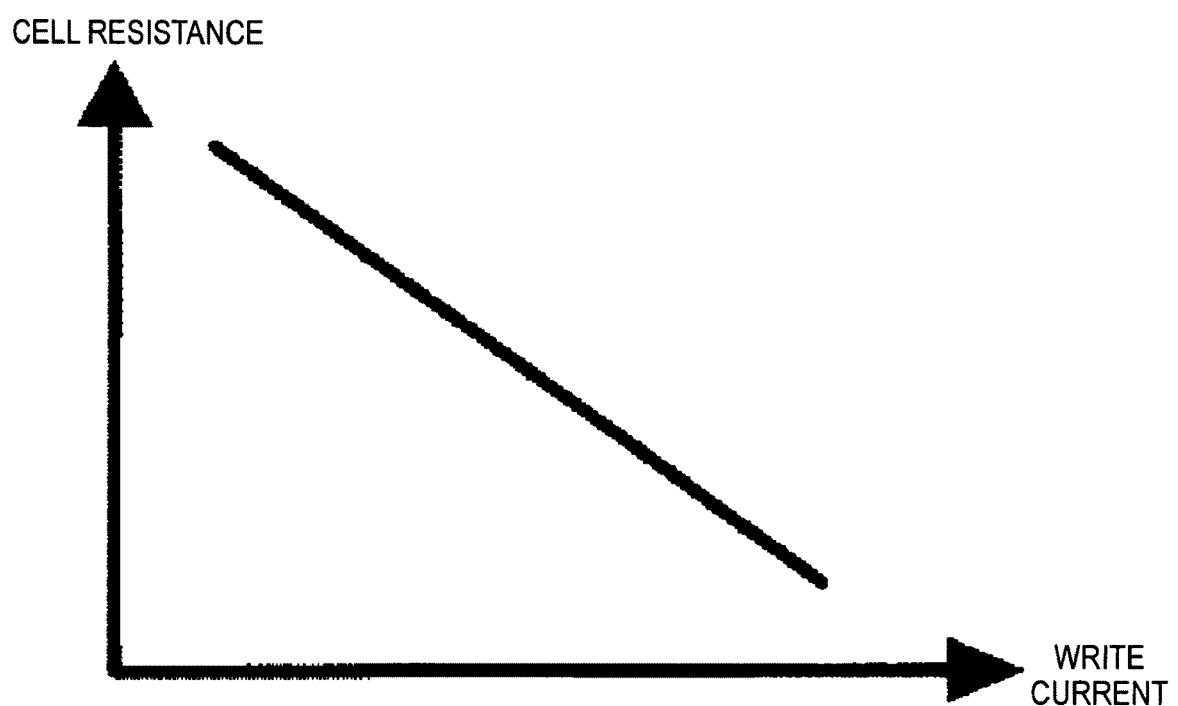
FIG. 4 is a view showing the relation of a write current value and a cell resistance.
Figure 5:
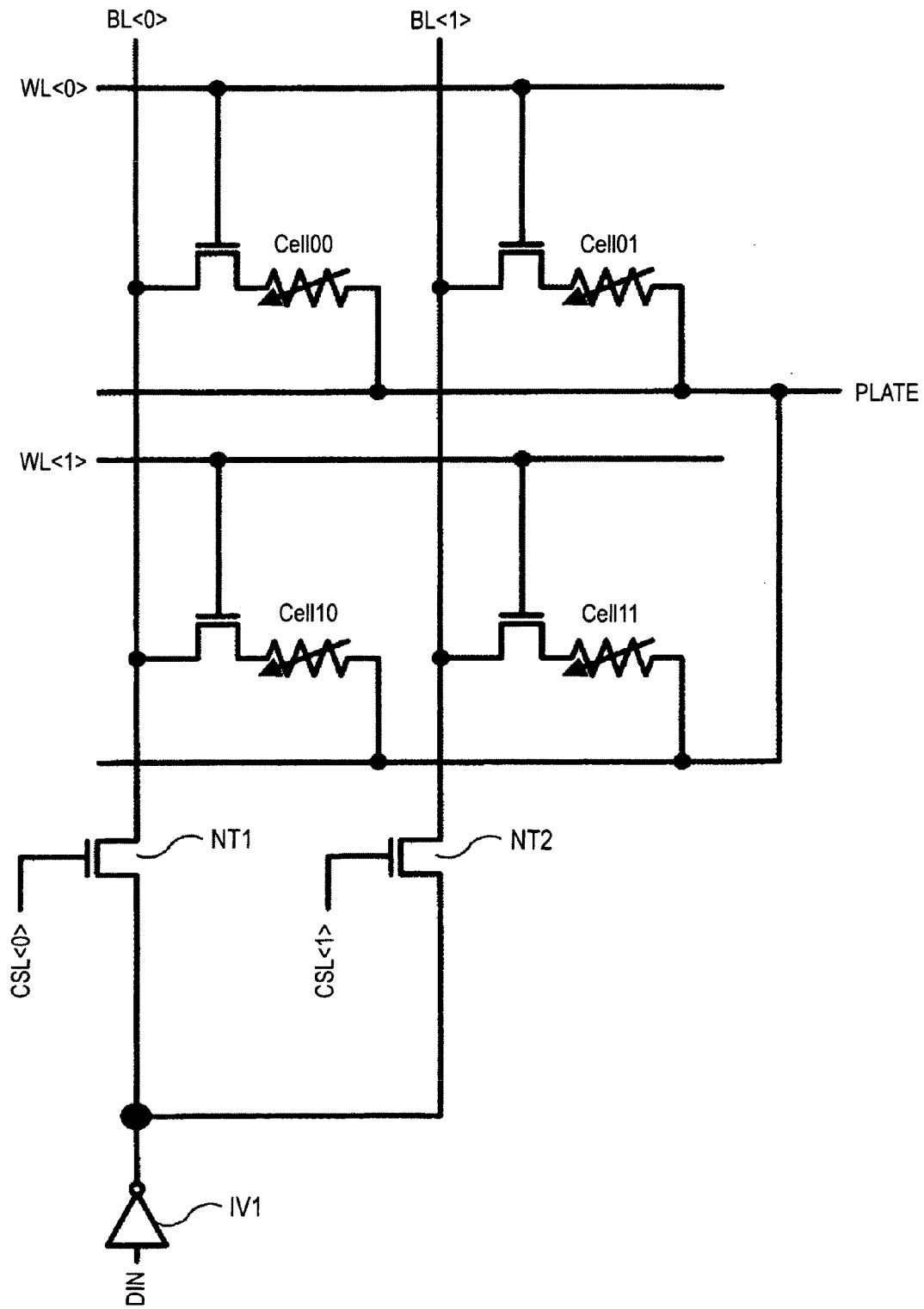
FIG. 5 is a view showing an example of the configuration of a memory cell array.
Figure 6:
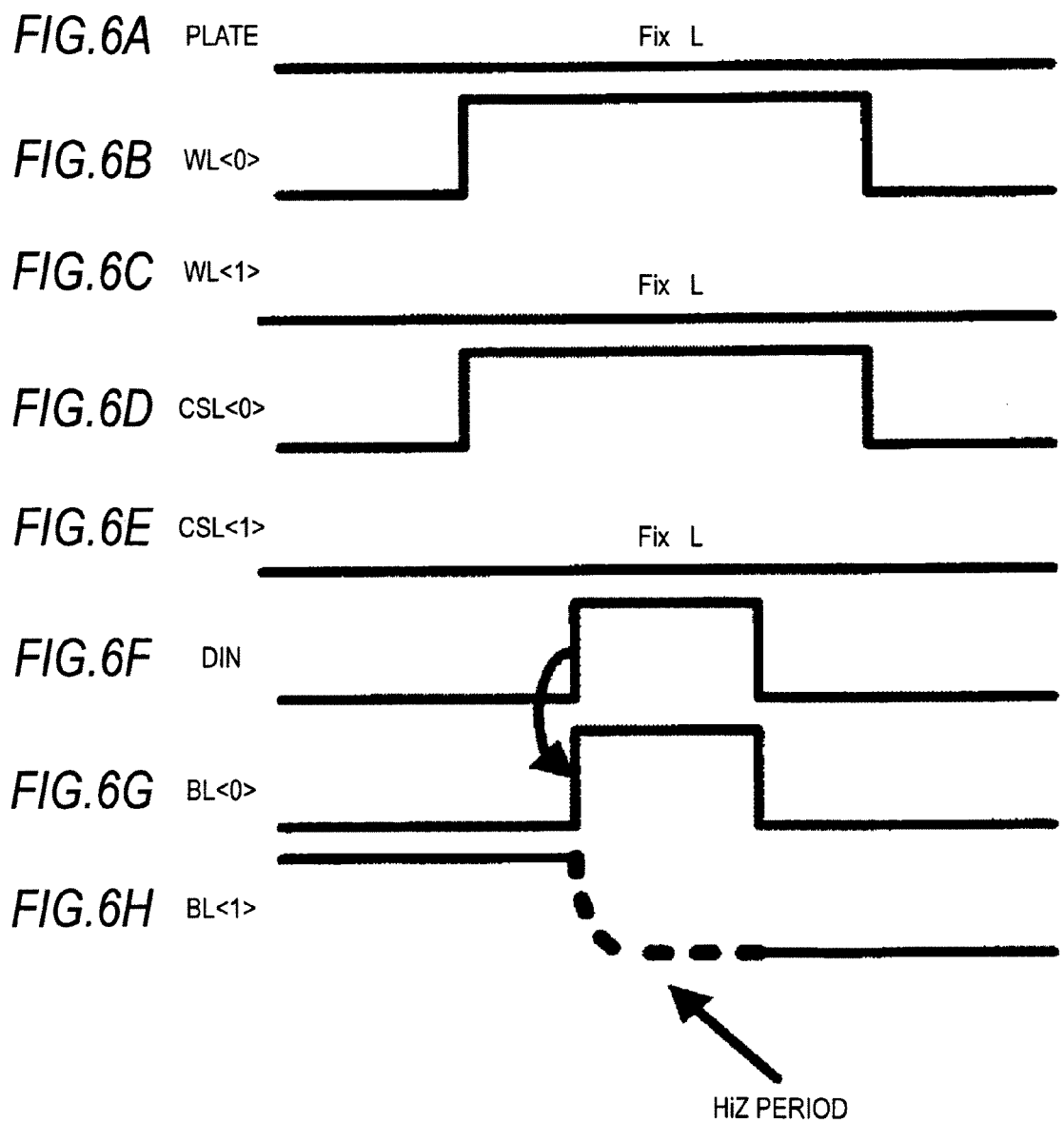
FIG. 6A through FIG. 6H are operating waveforms charts of the circuit of FIG. 5.

In the memory cell array portion 110, a plurality of resistance RAM cells (memory cells) 111 are disposed in a matrix with m rows and n columns (m×n). In FIG. 7, a 2×2 matrix is used for ease of illustration. As the resistance memory 111, an ion-conducting memory shown in FIG. 1 is used by way of example. It should be appreciated, however, that memories of other types (a magnetoresistive memory, a phase-change memory, and so forth) are also available.

Further, a row of dummy memory cells DCEL are provided in the memory cell array portion 110 of this embodiment.

Herein, assume that the memory cell 111 has the device structure of FIG. 1 by way of example.

In this embodiment, it is configured in such a manner that non-selected bit lines not selected by the column switch 160 are pre-charged to the plate potential for the 1T1R memory cells 111.

It may be configured in such a manner that a pre-charge operation is performed during at least one of a cell write operation and a cell erase operation. In this embodiment, a pre-charge operation is performed, for example, during a cell write operation and a cell erase operation.

It may be configured in such a manner that whether a pre-charge operation is performed arbitrarily during a cell write operation and an erase operation is selectable.

It may be configured in such a manner that a disturb is avoided by turning OFF a pre-charge and maintaining a bit line voltage in a dynamic state during a cell write operation and an erase operation.

It may be configured in such a manner that a pre-charge operation is performed by a dummy memory cell DCEL (an element formed of only 1T, that is, it is equivalent to a 1T1R memory cell from which a resistor element is omitted).

It may be configured in such a manner that a method of omitting a resistor element in forming a dummy memory cell DCEL includes a method of providing a state where no resistor element is physically present (no pattern is present).

It may be configured in such a manner that a method of omitting a resistor element in forming a dummy memory cell DCEL includes a method of physically providing a resistor element while making the resistor element low resistance so that the resistor element is in a state equivalent to a state where there is no resistance.

The memory cell 111 has a memory element (resistor) 112 including a memory layer sandwiched between a first electrode and a second electrode and having a resistance value that varies with a voltage applied between the first electrode and the second electrode and an access transistor 113 controlled by a word line WL.

In the memory cell array portion 110, word lines WL<0> through WL<m> for access transistor are provided in rows respectively corresponding to the row arrangement of the memory cells 111.

Also, in the memory cell array portion 110, bit lines BL<0> through BL<n> are provided in columns respectively corresponding to the column arrangement of the memory cells 111 so as to cross the word lines WL<0> through WL<m>.

The gate electrodes of the access transistors 113 in the memory cells 111 disposed in the same rows are connected commonly to the word lines WL<0> through WL<m> provided in the corresponding rows.

One of the diffusion layers (one of the source and drain regions) of the access transistors 113 in the memory cells 111 disposed in the same columns are connected commonly to the bit lines BL<0> through BL<n> provided in the corresponding columns.

In each memory cell 111, one end of the memory element (resistor) 112 is connected to a plate voltage supply line LVPLATE and the other end is connected to the other diffusion layer (the other source and drain region) of the access transistor 113.

In the memory cell 111, the first electrode is formed of the same conductive layer as the plate voltage supply line LVPLATE or it is formed of another conductive layer and connected to the plate voltage supply line LVPLATE.

Also, in the memory cell 111, the second electrode is connected to the other diffusion layer (the other source and drain region) of the access transistor 113.

Figure 8A:
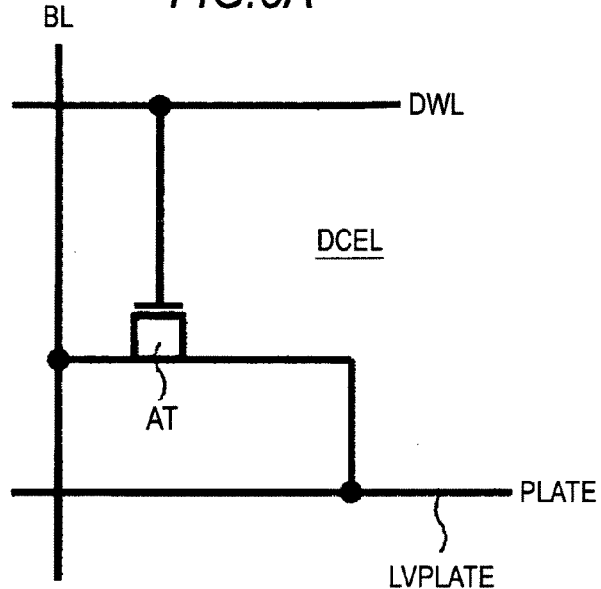
FIG. 8A and FIG. 8B are views showing an example of the configuration of a dummy memory cell according to an embodiment of the present invention.
Figure 8B:
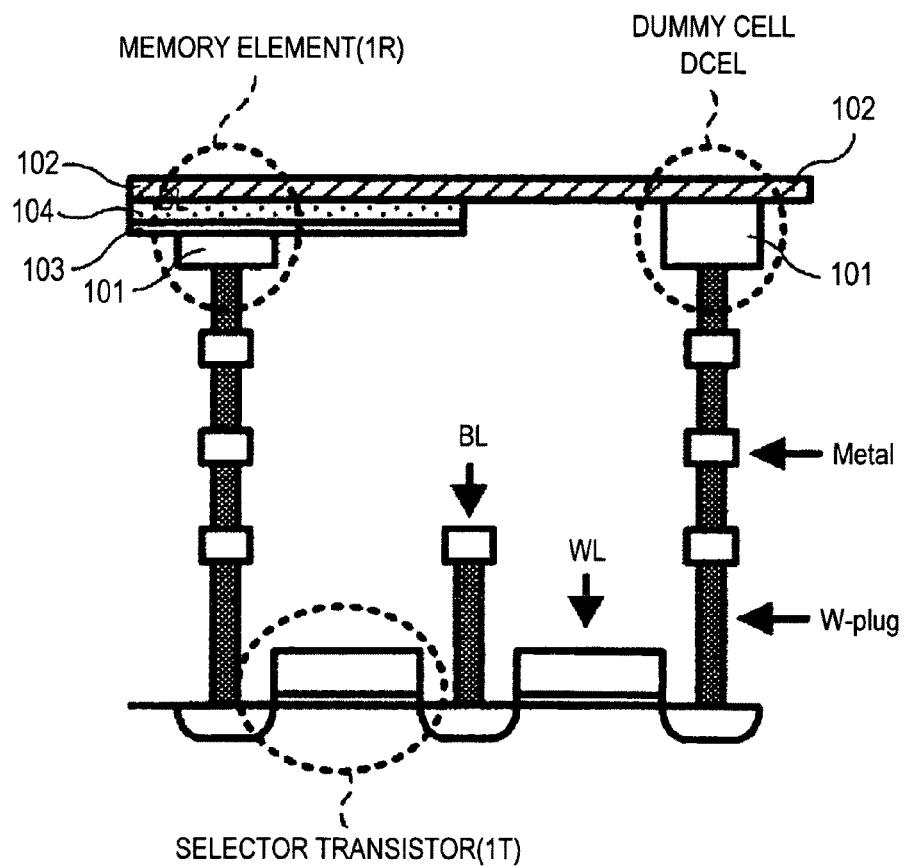

FIG. 8A and FIG. 8B are views showing an example of the configuration of the dummy memory cell DCEL of an embodiment. FIG. 8A shows an equivalent circuit and FIG. 8B schematically shows the sectional structure.

The dummy memory cell DCEL has the same configuration as the memory cell 111.

It should be noted, however, that it is formed, as are shown in FIG. 8A and FIG. 8B, as a memory element having an access transistor AT alone in a state where no resistor element is present.

For example, as is shown in FIG. 8B, the bottom electrode (fourth metal layer in FIG. 8B) 101 and the top electrode 102 are connected directly without sandwiching the resistance layer 103 and the ion source layer 104 between the bottom electrode 101 and the top electrode 102.

The gate of the access transistor AT in the dummy memory cell DCEL is connected to a dummy word line DWL.

One of the diffusion layers (one of the source and drain regions) of the access transistors AT are connected to the bit lines BL<0> through BL<n> provided in the corresponding columns.

The other diffusion layers (the other source and drain regions) of the access transistors AT are connected commonly to the plate voltage supply line LVPLATE.

The pre-decoder 120 pre-decodes an input address and separates the input address to an X address and a Y address, which are supplied to the X address decoder 130 and the column switch driver 150, respectively.

The pre-decoder 120 includes, for example, a Y address decoder.

Figure 9:
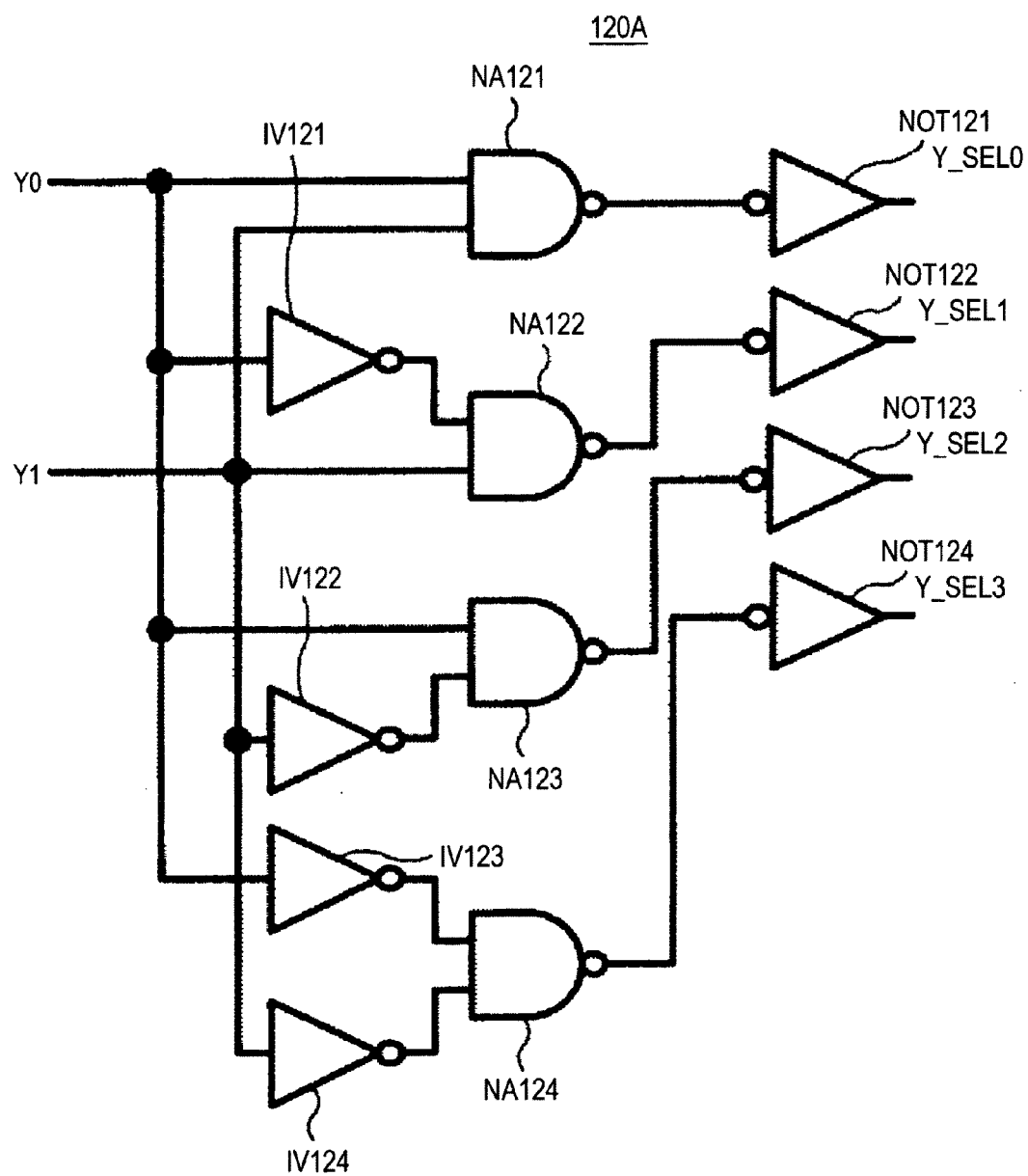
FIG. 9 is a circuit diagram showing an example of the fundamental configuration of a Y address decoder.

FIG. 9 is a circuit diagram showing an example of the fundamental configuration of a Y address decoder of an embodiment.

A Y address decoder 120A of FIG. 9 has a configuration corresponding to inputs of two addresses Y0 and Y1 as the fundamental configuration.

The Y address decoder 120A has 2-input NAND circuits NA121 through NA124, inverters IV121 through IV124, and NOT circuits NOT121 through NOT124.

First inputs of the NAND circuits NA121 and NA123 and inputs of the inverters IV121 and IV123 are connected to an input line of the Y address Y0.

A second input of the NAND circuit NA121 and a second input of the NAND circuit NA122 as well as inputs of the inverters IV121 and IV124 are connected to an input line of the Y address Y1. An output of the inverter IV121 is connected to a first input of the NAND circuit NA122 and an output of the inverter IV122 is connected to a second input of the NAND circuit NA123. An output of the inverter IV123 is connected to a first input of the NAND circuit NA124 and an output of the inverter IV124 is connected to a second input of the NAND circuit NA124.

An output of the NAND circuit NA121 is connected to an input of the NOT circuit NOT121 and an output of the NAND circuit NA122 is connected to an input of the NOT circuit NOT122. An output of the NAND circuit NA123 is connected to an input of the NOT circuit NOT123 and an output of the NAND circuit NA124 is connected to an input of the NOT circuit NOT124.

In the Y address decoder 120A, in a case where a Y address (Y1, Y0) is (0, 0), an active-high Y select signal Y_SEL3 is outputted from the NOT circuit NOT124.

In a case where the Y address (Y1, Y0) is (0, 1), an activated active-high Y select signal Y_SEL2 is outputted from the NOT circuit NOT123.

In a case where the Y address (Y1, Y0) is (1, 0), an activated active-high Y select signal Y_SEL1 is outputted from the NOT circuit NOT122.

In a case where the Y address (Y1, Y0) is (1, 1), an activated active-high Y select signal Y_SEL0 is outputted from the NOT circuit NOT121.

Upon receipt of X addresses X0, X1, and so on, the X address decoder 130 makes X select signals X_SEL0, X_SEL1, . . . , and so on that specify word lines to be selected active (for example, a high level), which are outputted to the word line driver 140.

Figure 10:
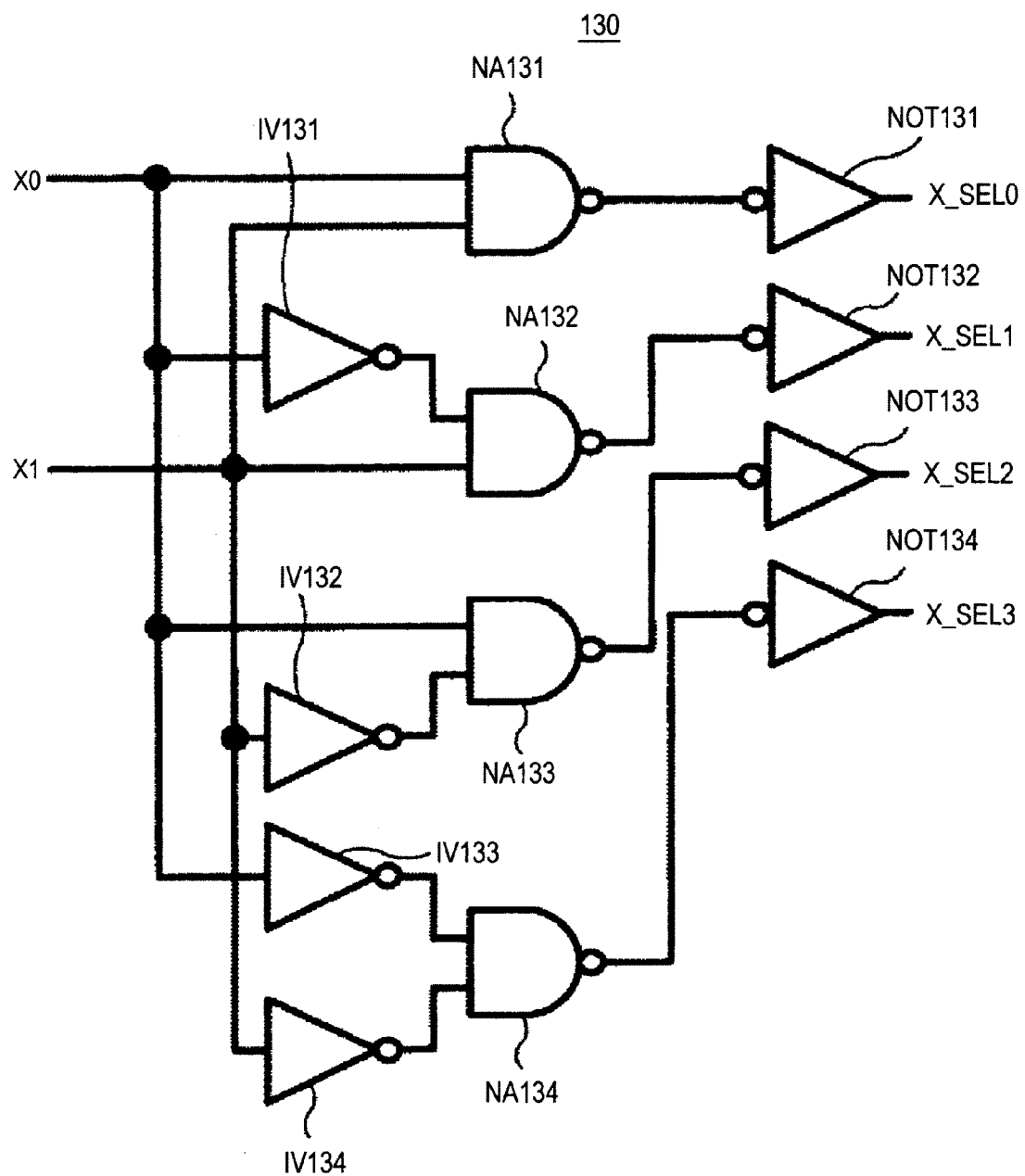
FIG. 10 is a circuit diagram showing an example of the fundamental configuration of an X address decoder.

FIG. 10 is a circuit diagram showing an example of the fundamental configuration of the X address decoder of this embodiment.

The X address decoder 130 of FIG. 10 has a configuration corresponding to inputs of two addresses X0 and X1 as the fundamental configuration.

The X address decoder 130 has 2-input NAND circuit NA131 through NA134, inverters IV131 through IV134, and NOT circuits NOT131 through NOT134.

First inputs of the NAND circuits NA131 and NA133 and inputs of the inverters IV131 and IV133 are connected to an input line of the X address X0.

A second input of the NAND circuit NA131, a second input of the NAND circuit NA132, and inputs of the inverters IV132 and IV134 are connected to an input line of the X address X1. An output of the inverter IV131 is connected to a first input of the NAND circuit NA132 and an output of the inverter IV132 is connected to a second input of the NAND circuit NA133. An output of the inverter IV133 is connected to a first input of the NAND circuit NA134 and an output of the inverter IV134 is connected to a second input of the NAND circuit NA134.

An output of the NAND circuit NA131 is connected to an input of the NOT circuit NOT131 and an output of the NAND circuit NA132 is connected to an input of the NOT circuit NOT132. An output of the NAND circuit NA133 is connected to an input of the NOT circuit NOT133 and an output of the NAND circuit NA134 is connected to an input of the NOT circuit NOT134.

In the X address decoder 130, in a case where an X address (X1, X0) is (0, 0), an active-high X select signal X_SEL3 is outputted from the NOT circuit NOT134.

In a case where the X address (X1, X0) is (0, 1), an active-high X select signal X_SEL2 is outputted from the NOT circuit NOT133.

In a case where the X address (X1, X0) is (1, 0), an active-high X select signal XSEL_1 is outputted from the NOT circuit NOT132.

In a case where the X address (X1, X0) is (1, 1), an active-high X select signal X_SEL0 is outputted from the NOT circuit NOT131.

The word line driver 140 drives a word line WL (sets it at a high level) specified by an X address in response to an X select signal X_SEL from the X address decoder 120 and a word line enable signal WLEN from the control portion 170.

Figure 11:
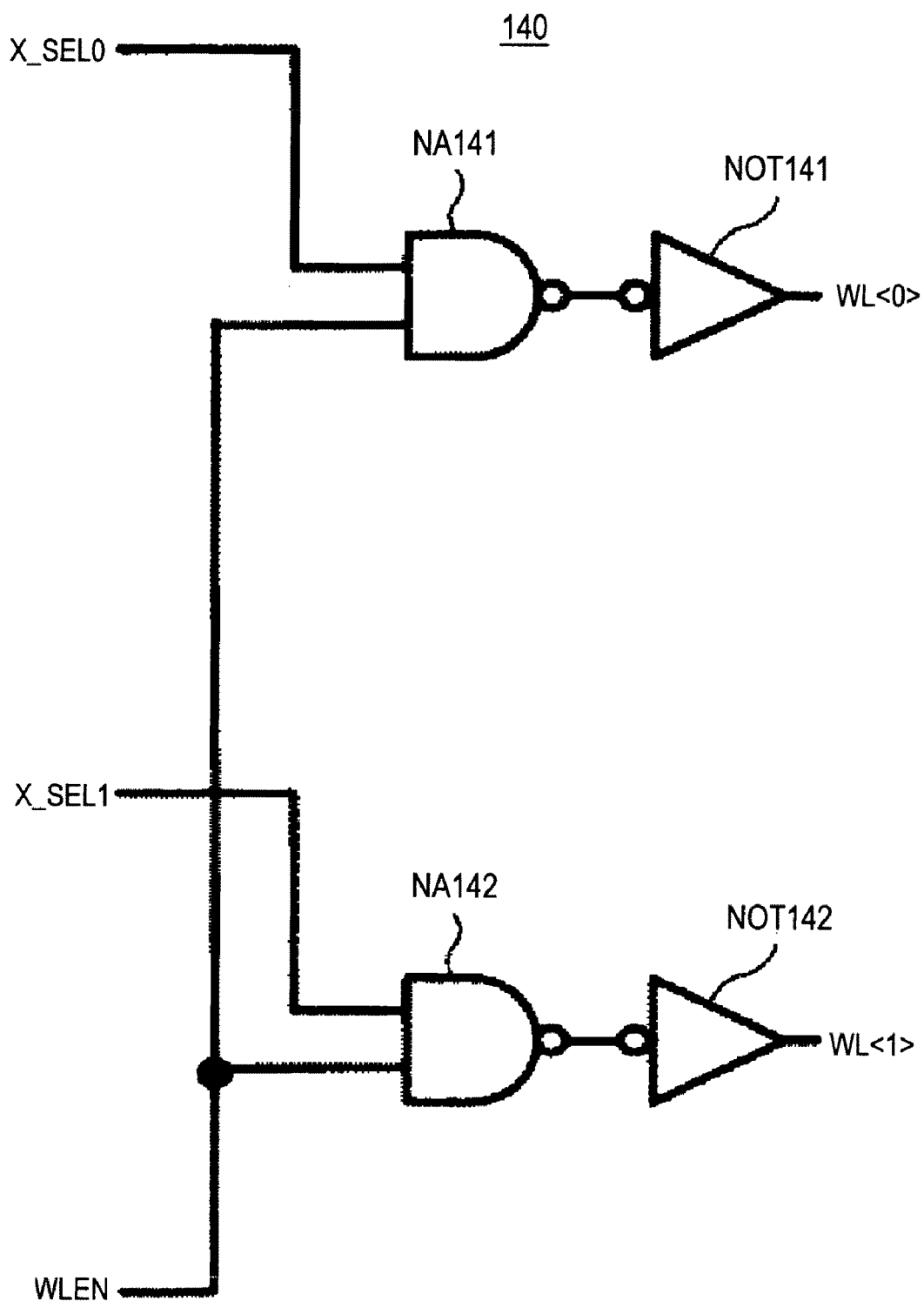
FIG. 11 is a view showing an example of the configuration of a word line driver according to an embodiment of the present invention.

FIG. 11 is a view showing an example of the configuration of the word line driver of an embodiment.

The word line driver 140 of FIG. 11 has 2-input NAND circuits NA141 and NA142 and NOT circuits NOT141 and NOT142.

Upon input of the X select signal X_SEL0 generated in the X address decoder 130 and a word line enable signal WLEN from the control portion 170, the NAND circuit NA141 outputs the result of negative AND to the NOT circuit NOT141.

The word line WL in the row specified by the X address is driven by this drive signal via the NOT circuit NOT141.

Likewise, upon input of the X select signal X_SEL1 generated in the X address decoder 130 and a word line enable signal WLEN from the control portion 170, the NAND circuit NA142 outputs the result of negative AND to the NOT circuit NOT142.

The word line WL in the row specified by the X address is driven by this drive signal via the NOT circuit NOT142.

The column switch driver 150 generates a column switch signal SCSW in response to a Y select signal Y_SEL from the Y address decoder 120A and a column switch enable signal YSWEN from the control portion 170.

The column switch driver 150 drives a column switch (turns it ON) specified by the Y address with the column switch signal SCSW.

Figure 12:
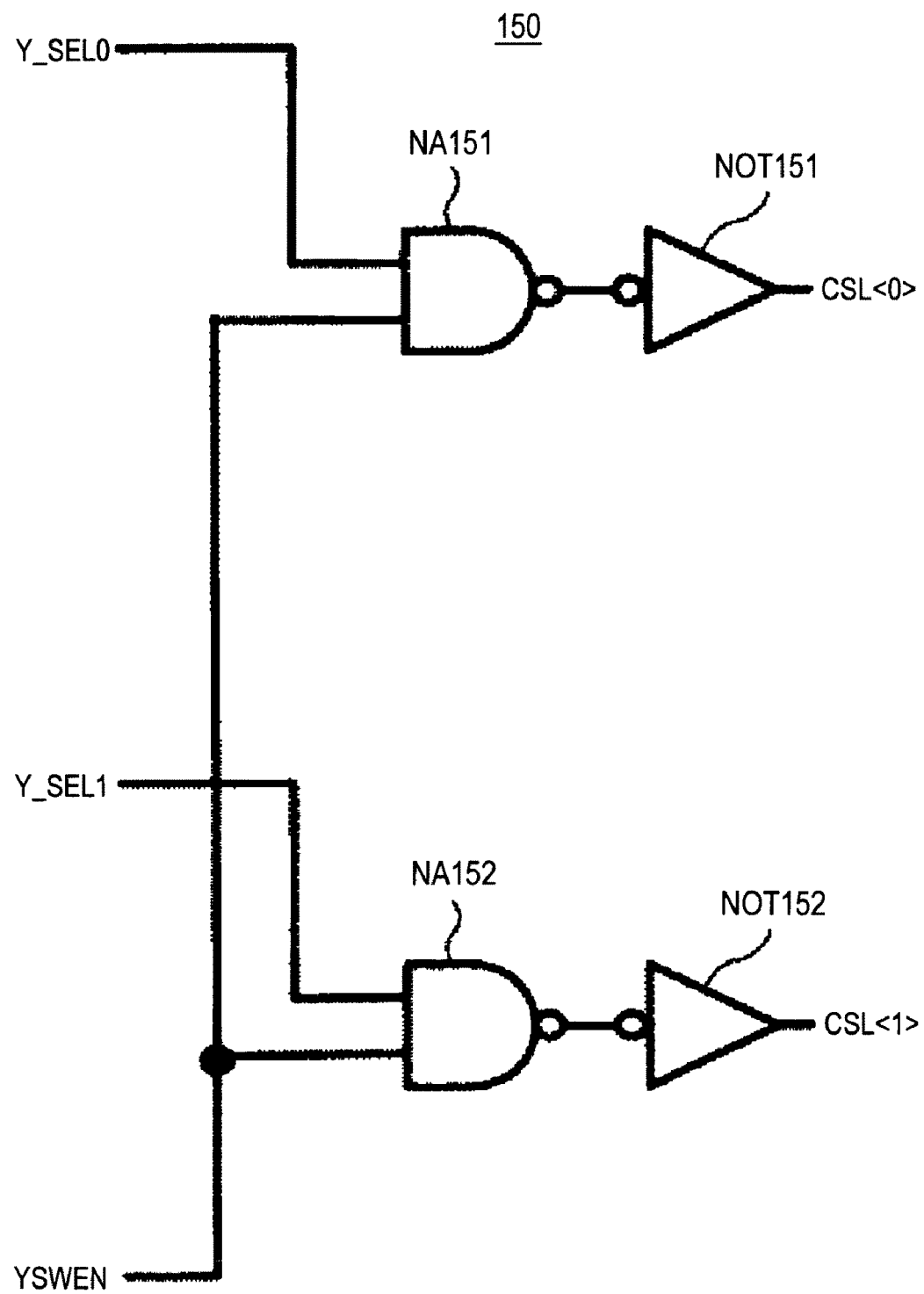
FIG. 12 is a view showing an example of the configuration of a column switch driver according to an embodiment of the invention.

FIG. 12 is a view showing an example of the configuration of the column switch driver of an embodiment.

The column switch driver 150 of FIG. 12 has 2-input NAND circuits NA151 and NA152 and NOT circuits NOT151 and NOT152.

Upon input of the Y select signal Y_SEL0 generated in the Y address decoder 120A and a column switch enable signal YSWEN from the control portion 170, the NAND circuit NA151 outputs the result of negative AND to the NOT circuit NOT151.

The column switch for the column specified by the Y address is driven by this drive signal via the NOT circuit NOT151.

Likewise, upon input of the Y select signal Y_SEL1 generated in the Y address decoder 120A and a column switch enable signal YSWEN from the control portion 170, the NAND circuit NA152 outputs the result of negative AND to the NOT circuit NOT152.

The column switch for the column specified by the Y address is driven by this drive signal via the NOT circuit NOT152.

In the column switch 160, a plurality of column switches that selectively connect the respective bit lines BL<0> through BL<n> and a column bit line CBL are provided for every bit line.

In the column switch 160, a column switch specified by the Y address is driven (turned ON) by the column switch driver 150.

According to the circuit method described herein, both the word lines WL and the column switch signals SCSW are varied with an amplitude of 0 V to VDD.

By controlling the potential of the word line WL, it becomes possible to adopt a method of varying the amplitude to a voltage made most suitable for each of write, erase, and read operations.

As one of the control methods of word line potential, it is possible to adopt a configuration by which more than one potential of the world lines WL is prepared so that the potentials are switched depending on the operations.

Figure 13:
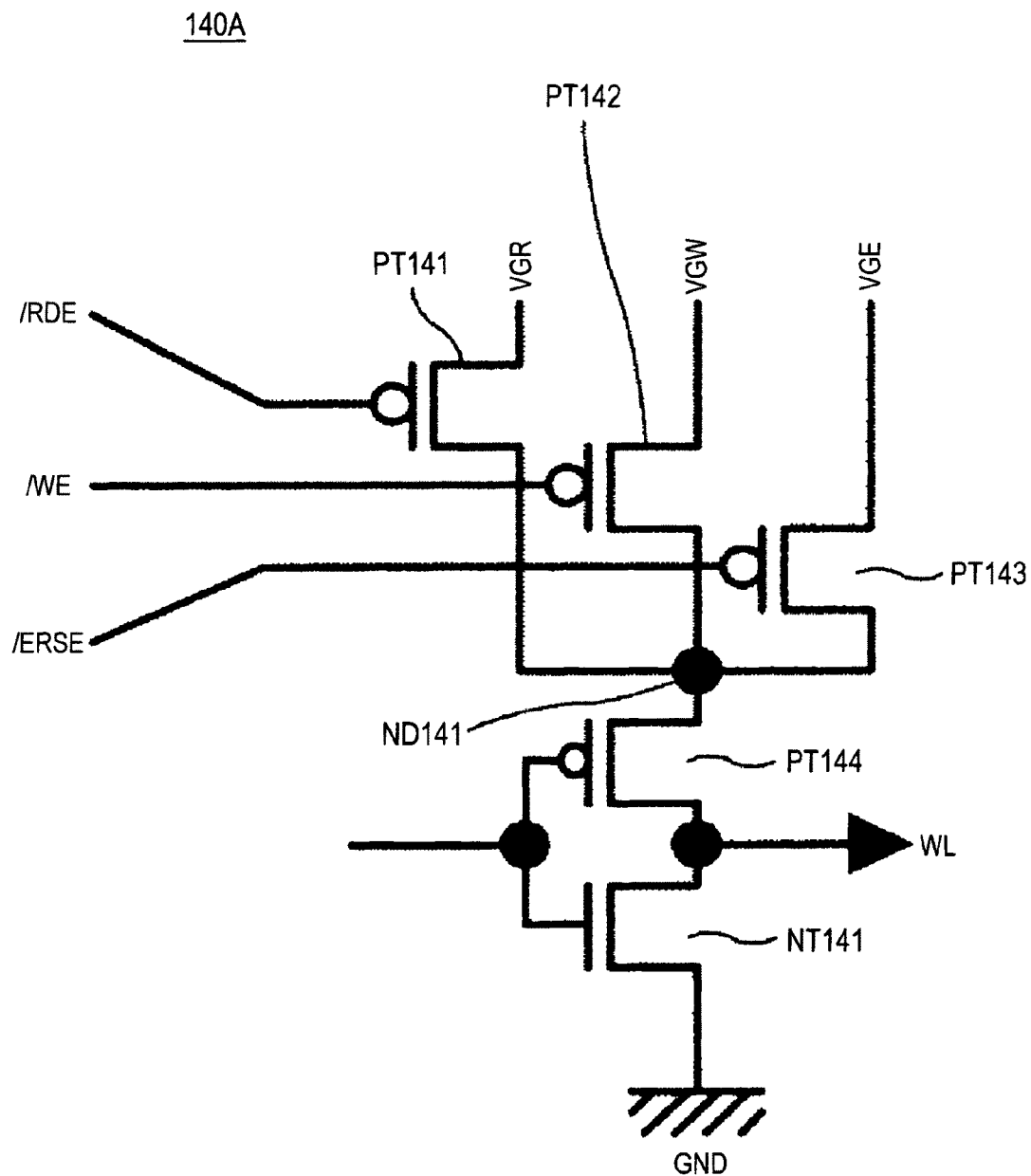
FIG. 13 is a view showing an example of the configuration of a circuit configured to prepare more than one potential of word lines so that the potentials are switched depending on operations.

FIG. 13 is a view showing an example of the circuit configuration by which more than one potential of the word lines is prepared so that the potentials are switched depending on the operations.

A circuit 140A has PMOS transistors PT141 through PT144, an NMOS transistor NT141, and a node ND141.

The drains of the PMOS transistors PT141 through PT143 are commonly connected to the node ND141.

The source of the PMOS transistor PT141 is connected to a supply line of a voltage VGR and the gate thereof is connected to a supply line of an active-low read enable signal/RDE.

The source of the PMOS transistor PT142 is connected to a supply line of a voltage VGW and the gate thereof is connected to a supply line of an active-low write enable signal/WE.

The source of the PMOS transistor PT143 is connected to a supply line of a voltage VGE and the gate thereof is connected to a supply line of an active-low erase enable signal/ERSE.

The source of the PMOS transistor PT144 is connected to the node ND141 and the drain thereof is connected to the drain of the NMOS transistor NT141. The source of the NMOS transistor NT141 is grounded.

Input signals are supplied to the gate of the PMOS transistor PT144 and the gate of the NMOS transistor NT141.

More specifically, the PMOS transistor PT144 and the NMOS transistor NT141 together form a CMOS buffer and the level on the power supply side is the level selected by the respective enable signals.

As another example of the control method of the word line potential, it is possible to adopt a configuration in which a word line WL power supply is shared and the power supply potentials of the word lines WL per se are switched depending on the operations.

Figure 14:
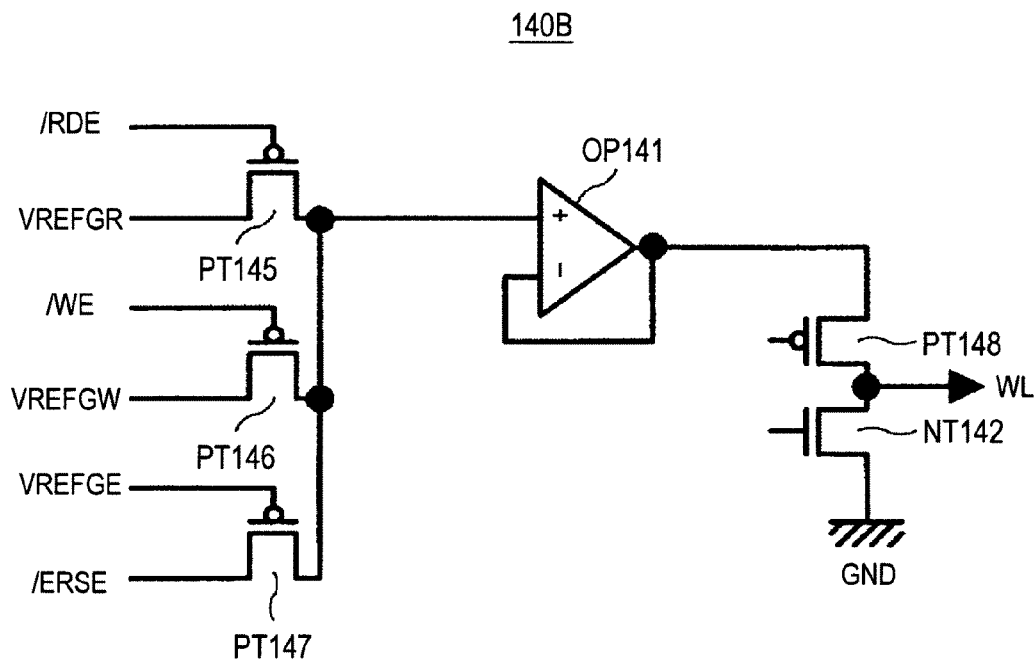
FIG. 14 is a view showing an example of the circuit configuration configured to share a word line power supply so that the power supply potentials of the word lines per se are switched depending on the operations.

FIG. 14 is a view showing an example of the circuit configuration by which the word line power supply is shared and the power supply potentials of the word lines WL per se are switched depending on the operations.

A circuit 140B of FIG. 14 has PMOS transistors PT145 through PT148, an NMOS transistor NT142, and an operational amplifier OP141 (negative feedback buffer).

The drains of the PMOS transistors PT145 through PT147 are connected commonly to a non-inverting input terminal (+) of the operational amplifier OP141.

The source of the PMOS transistor PT145 is connected to a supply line of a reference voltage VREFGR and the gate thereof is connected to a supply line of an active-low read enable signal/RDE.

The source of the PMOS transistor PT146 is connected to a supply line of a reference voltage VREFGW and the gate thereof is connected to a supply line of an active-low write enable signal/WE.

The source of the PMOS transistor PT147 is connected to a supply line of a reference voltage VREFGE and the gate thereof is connected to a supply line of an active-low erase enable signal/ERSE.

An output of the operational amplifier OP141 is fed back to its own inverting input terminal (−).

The source of the PMOS transistor PT148 is connected to an output of the operational amplifier OP141 and the drain thereof is connected to the drain of the NMOS transistor NT142. The source of the NMOS transistor NT142 is grounded.

As has been described, the circuit of FIG. 14 is configured in such a manner that the power supply of the word lines WL is shared and the power supply potentials of the word lines WL per se are switched depending on the operations.

In the case of the configuration described above, more than one power supply reference voltage of the word lines WL is prepared so that the input voltages to the negative feedback buffer are switched.

Upon receipt of an active read signal RD, the control portion 170 makes the read enable signal RDE active and outputs it to the sense amplifier 200.

Upon receipt of a write signal WRT, the control portion 170 outputs a write enable signal WE and a write drive signal WDRVE to both the write driver 190 and the plate driver 180.

Upon receipt of an erase signal ERS, the control portion 170 outputs the erase enable signal ERSE and the write drive signal WDRVE to both the write driver 190 and the plate driver 180.

The plate driver 180 controls the potential of the plate voltage supply line LVPLATE during write, erase, and read operations.

The plate driver 180 controls the potential of the plate voltage supply line LVPLATE during the write, erase, and read operations using a pulse signal.

Figure 15:
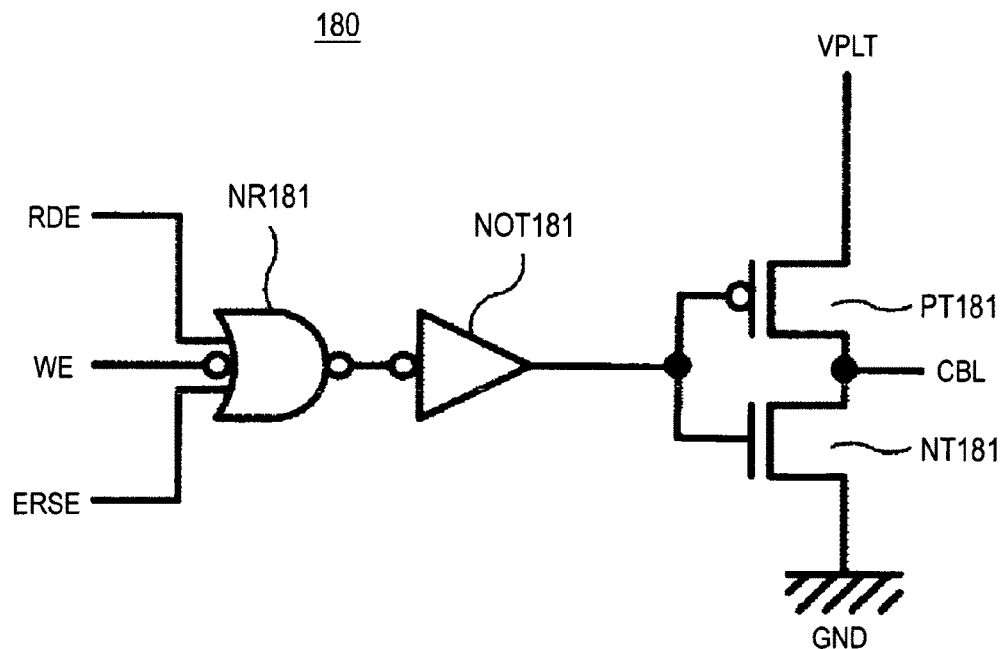
FIG. 15 is a view showing an example of the configuration of a plate driver that applies write and erase pulses.

FIG. 15 is a view showing an example of the configuration of a plate driver that applies write and erase pulses.

The plate driver 180 of FIG. 15 has a 3-input NOR circuit NR181, a NOT circuit NOT181, a PMOS transistor PT181, and an NMOS transistor NT181.

A first input of the NOR circuit NR181 is connected to a supply line of a read enable signal RDE, a second input, which is a negative input, is connected to a supply line of a write enable signal WE, and a third input is connected to a supply line of an erase enable signal ERSE.

An output of the NOR circuit NR181 is connected to an output of the NOT circuit NOT181. An output of the NOT circuit NOT181 is connected to the gates of the PMOS transistor PT181 and the NMOS transistor NT181 that together form a CMOS buffer.

The source of the PMOS transistor PT181 is connected to a supply line of a plate voltage VPLT and the drain thereof is connected to the drain of the NMOS transistor NT181. The source of the NMOS transistor NT181 is grounded.

The circuit of FIG. 15 is an example in which the plate potential is varied with an amplitude of a voltage VPLT to 0 V.

It is possible to set voltages most suitable for a write operation and an erase operation to the voltage VPLT.

It is also possible to set an arbitrary voltage to the VPLT potential using the same configuration as the word lines WL as shown in FIG. 13 and FIG. 14.

Figure 16:
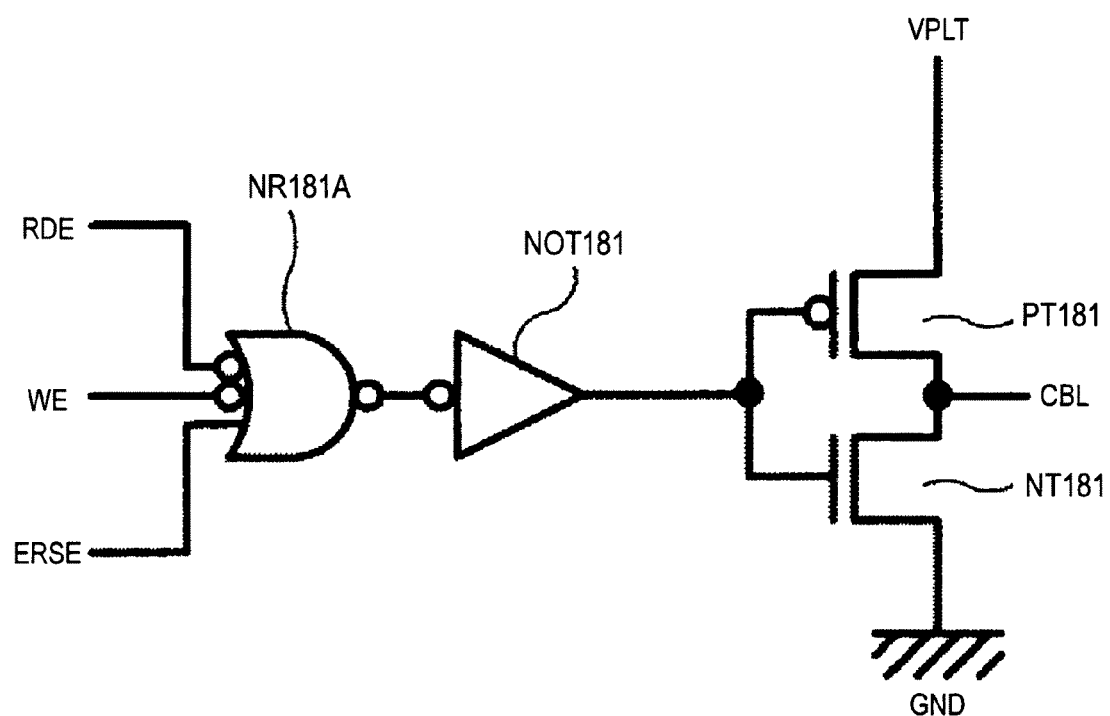
FIG. 16 is a view showing another example of the configuration of the plate driver that applies write and erase pulses.

FIG. 16 is a view showing another example of the configuration of the plate driver that applies write and erase pulses.

A difference of the circuit of FIG. 16 from the circuit of FIG. 15 is that the first input of the NOR circuit NR181 is a negative input.

The circuit of FIG. 15 is configured in such a manner that the plate potential is set to 0 V during a read operation. It is, however, possible to adopt a method of reading the plate potential in a high (H) state by changing the circuit logic as is shown in FIG. 16.

The write driver 190 drives the bit lines to be at predetermined potential via the column bit line CBL during write and erase operations.

Figure 17:
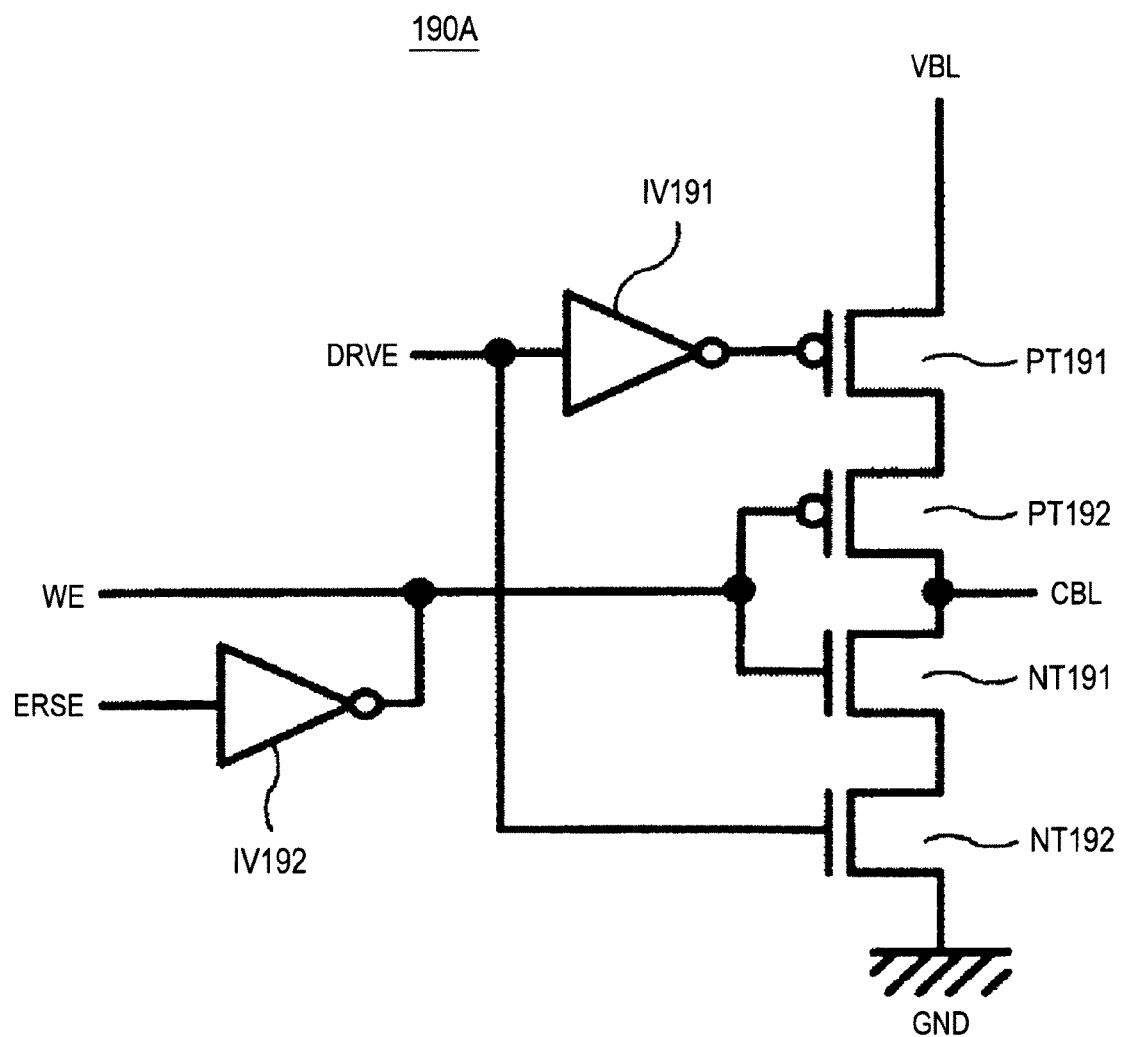
FIG. 17 is a view showing an example of the configuration of a write driver according to an embodiment of the present invention.

FIG. 17 is a view showing an example of the configuration of the bit line driver in the write driver of an embodiment.

A write driver 190A of FIG. 17 has PMOS transistors PT191 and PT192, NMOS transistors NT191 and NT192, and inverters IV191 and IV192.

The source of the PMOS transistor PT191 is connected to a supply line of the bit line voltage VBL and the drain thereof is connected to the source of the PMOS transistor PT192. The drain of the PMOS transistor PT192 is connected to the drain of the NMOS transistor NT191. The source of the NMOS transistor NT191 is connected to the drain of the NMOS transistor NT192. The source of the NMOS transistor NT192 is grounded.

The gate of the PMOS transistor PT191 is connected to an output of the inverter IV191.

An input of the inverter IV191 and the gate of the NMOS transistor NT192 are connected to a supply line of a drive enable signal DRVE.

The gate of the PMOS transistor PT192 and the gate of the NMOS transistor NT191 are connected to both a supply line of a write enable signal WE and an output of the inverter IV192.

An input of the inverter IV192 is connected to a supply line of an erase enable signal ERSE.

The write driver 190A functions as a clocked inverter.

FIG. 17 shows a driver circuit of the bit lines BL that apply write and erase pulses.

The circuit of FIG. 17 is an example where the potential of the bit lines BL is varied with an amplitude of VBL to V.

It is possible to set voltages most suitable for a write operation and an erase operation to a bit line voltage VBL.

Also, an arbitrary voltage can be set to the VBL potential by the same configuration as the word lines WL as shown in FIG. 13 and FIG. 14.

The sense amplifier 200 amplifies read data and outputs the amplified read data to the input/output buffer 210.

Figure 18:
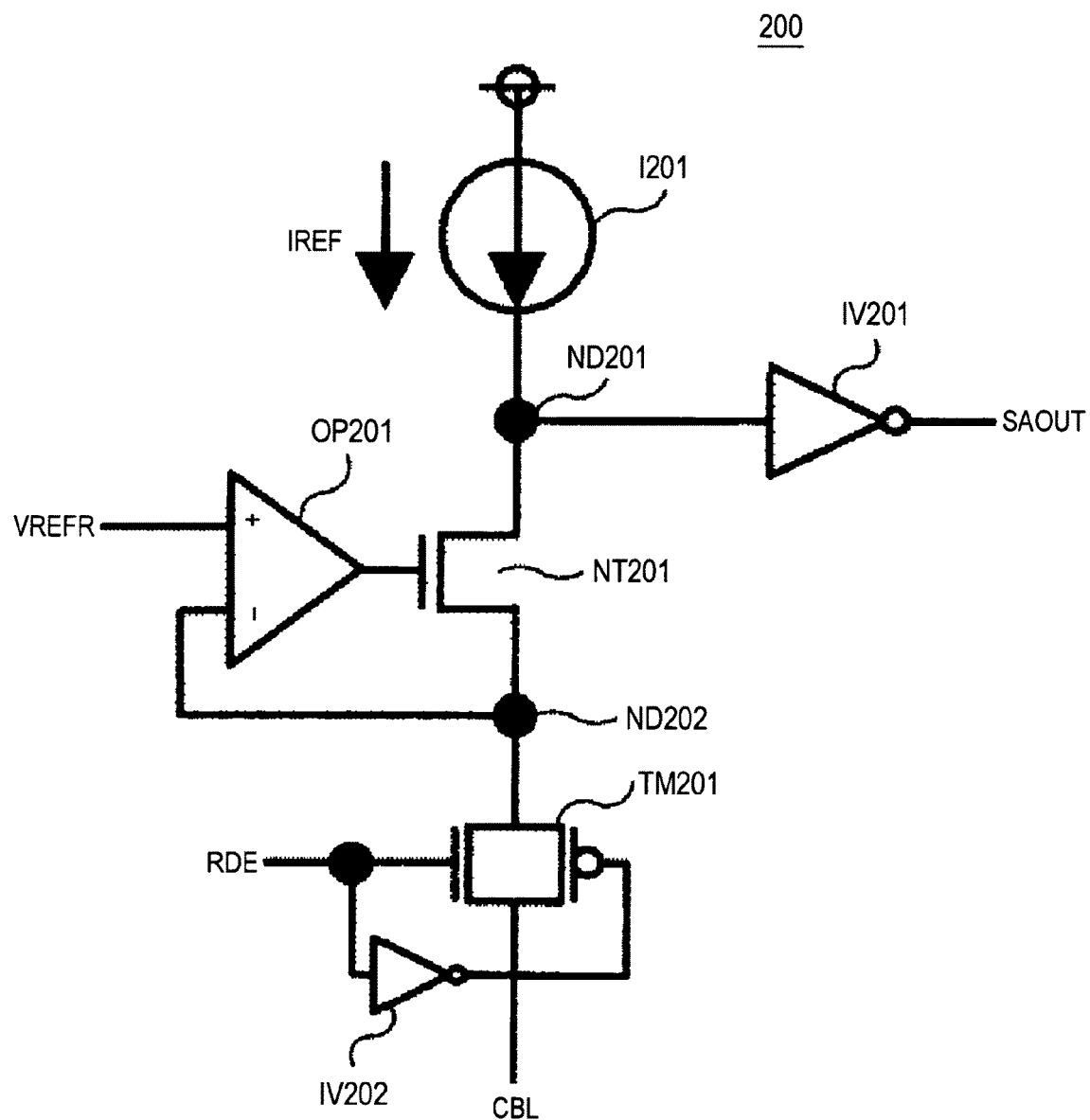
FIG. 18 is a view showing an example of the configuration of a sense amplifier according to an embodiment of the present invention.

FIG. 18 is a view showing an example of the configuration of the sense amplifier of this embodiment.

The sense amplifier 200 of FIG. 18 has a current source I201, an NMOS transistor NT201, an operational amplifier OP201 (negative feedback amplifier), a transfer gate TM201, inverters IV201 and IV202, and nodes ND201 and ND202.

The current source I201 is connected to both the power supply voltage source VDD and the node ND201.

An input of the inverter IV201 and the drain of the NMOS transistor NT201 are connected to the node ND201.

The source of the NMOS transistor NT201 is connected to the node ND202.

The inverting input terminal (−) of the operational amplifier OP201 and one of the input/output terminals of a transfer gate TM210 are connected to the node ND202.

The non-inverting input terminal (+) of the operational amplifier OP201 is connected to a supply line of a reference voltage VREFR and an output thereof is connected to the gate of the NMOS transistor NT201.

The other input/output terminal of the transfer gate TM201 is connected to the column bit line CBL. The gate of the PMOS transistor forming the transfer gate TM201 is connected to an output of the inverter IV202 and the gate of the NMOS transistor and an input of the inverter IV202 are connected to a supply line of a read enable signal RDE.

In the sense amplifier 200, the NMOS transistor NT201 and the negative feedback amplifier OP201 perform control in order to control a voltage of the bit line BL applied to the memory cell 111 during a read operation to be the reference voltage VREFR.

Subsequently, the reference current IREF is compared with the memory cell current and the result is outputted from the inverter IV201 as SAOUT.

The potential control operation of non-selective bit lines of this embodiment will now be described in correlation with FIG. 19 through FIG. 21I.

Figure 19:
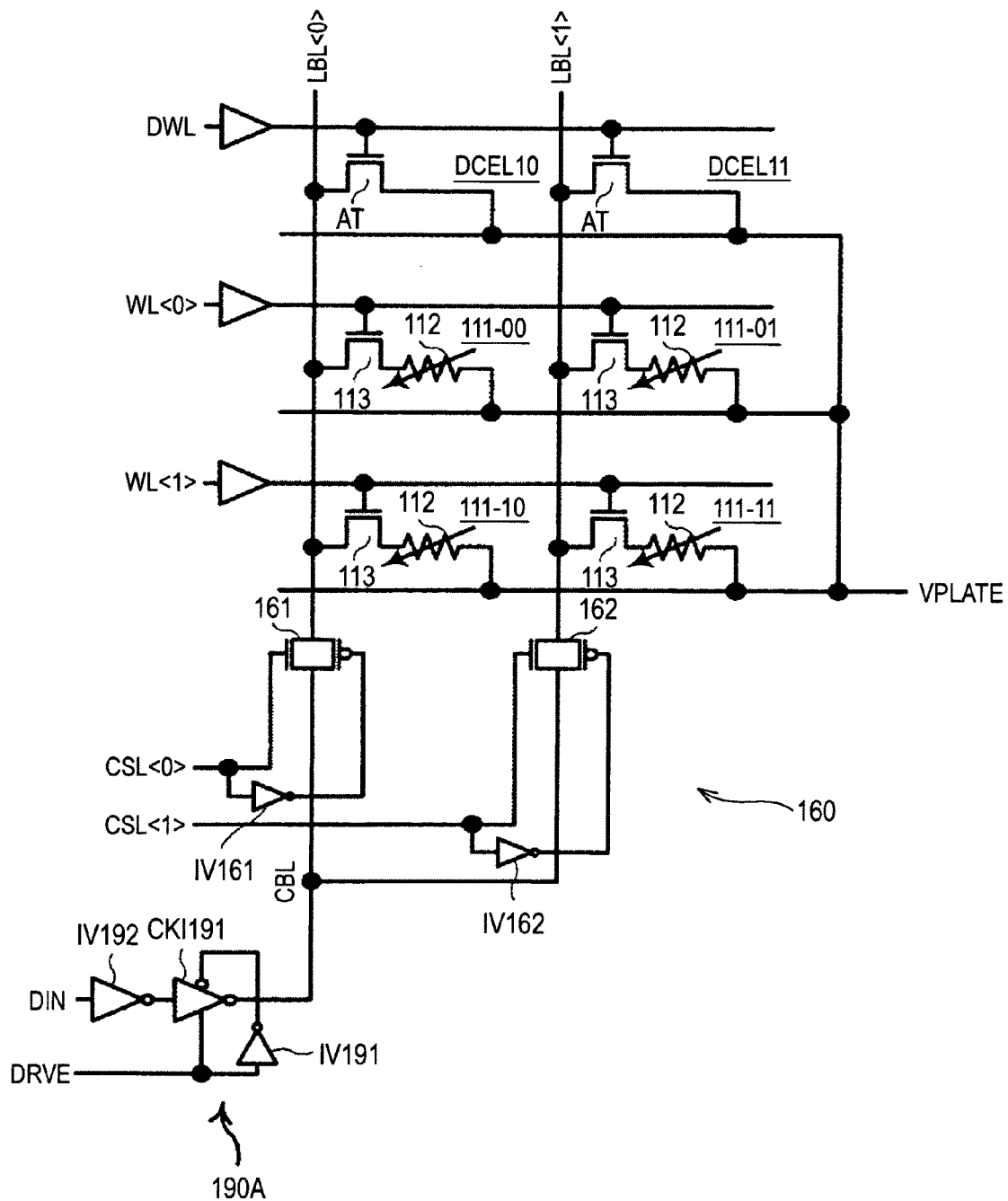
FIG. 19 is a circuit diagram used to describe a potential control operation of a non-selected bit line according to an embodiment of the present invention.
Figure 20:
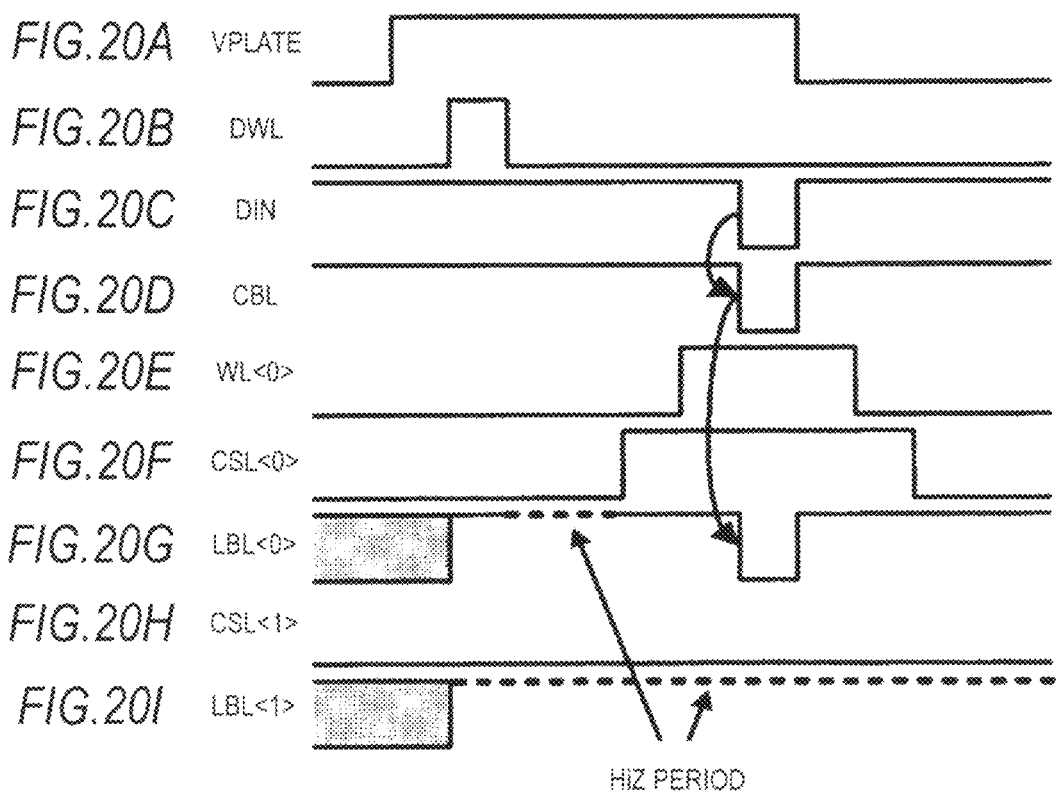
FIG. 20A through FIG. 20I are operating waveform charts of the circuit of FIG. 19 during a write operation.
Figure 21:
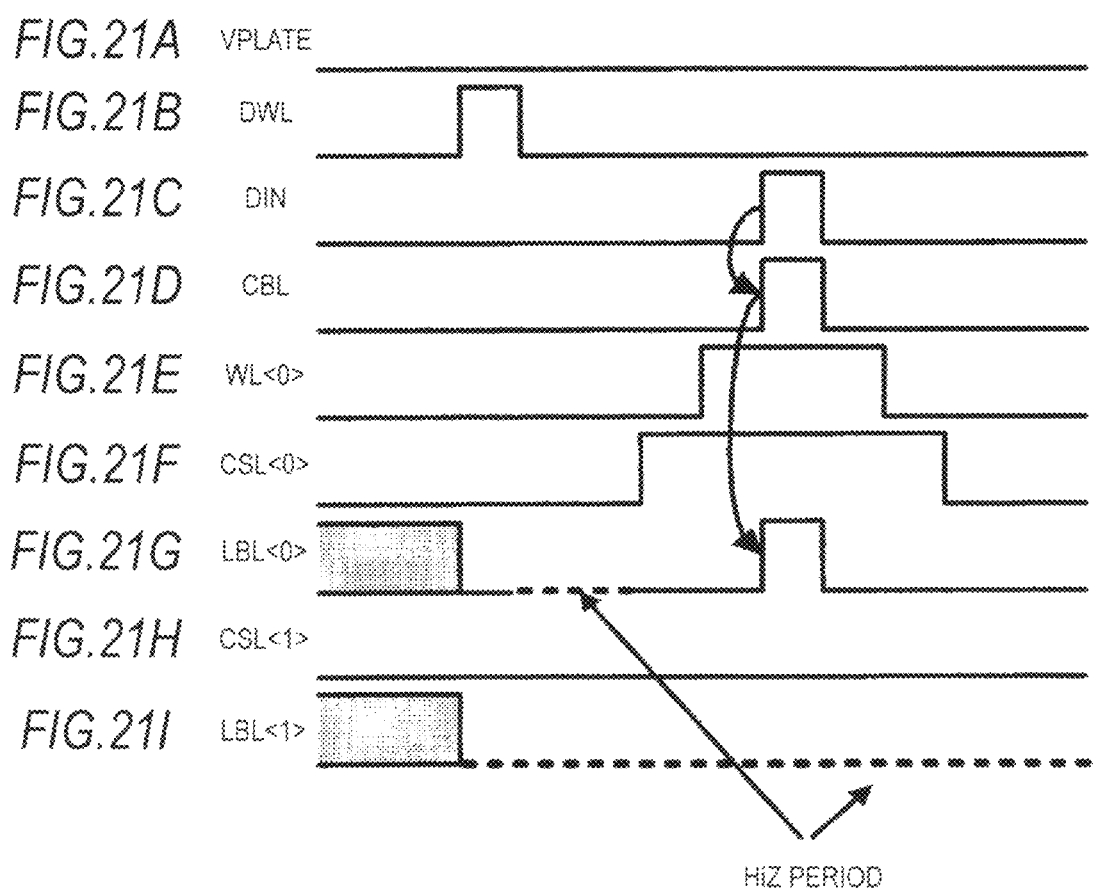
FIG. 21A through FIG. 21I are operating waveform charts of the circuit of FIG. 19 during an erase operation.

FIG. 19 is a circuit diagram showing a potential control system of a non-selected bit line of an embodiment.

FIG. 20A through FIG. 20I are operating waveform charts of the circuit of FIG. 19 during a write operation.

FIG. 21A through FIG. 21I are operating waveform charts of the circuit shown in FIG. 19 during an erase operation.

FIG. 20A and FIG. 21A show the potential of the plate voltage VPLATE. FIG. 20B and FIG. 21B show the potential of the dummy word line DWL. FIG. 20C and FIG. 21C show the level of the data DIN. FIG. 20D and FIG. 21D show the potential of the column bit line CBL. FIG. 20E and FIG. 21E show the potential of the word line WL<0>.

FIG. 20F and FIG. 21F show the level of the column select signal SCL<0>. FIG. 20G and FIG. 21G show the level of the bit line LBL<0>. FIG. 20H and FIG. 21H show the level the column select signal SCL<1>. FIG. 20I and FIG. 21I show the level of the bit line LBL<1>.

The other ends of the memory elements (resistors) in the respective memory cells 111-00 through 111-11 and the sources of the access transistors AT in the dummy memory cells DCEL10 and CDEL11 are connected commonly to the plate voltage supply line LVPLATE.

Referring to FIG. 19, the write driver 190A has a clocked inverter CK1191 and inverters IV191 and IV192. This configuration corresponds to the configuration of FIG. 17.

The column switch 160 has transfer gate switches 161 and 162 in which the sources and the drains of the PMOS transistor and the NMOS transistor are connected to each other and inverts IV161 and IV162.

The transfer gate switch 161 is connected to the bit line LBL<0> at one of the input/output terminals and connected to the column bit line CBL at the other input/output terminal.

The gate of the PMOS transistor forming the transfer gate switch 161 is connected to an output of the inverter IV161 and the gate of the NMOS transistor and an input of the inverter IV161 are connected to a supply line of the column select signal SCL<0>.

The transfer gate switch 162 is connected to the bit line LBL<1> at one of the input/output terminals and connected to the column bit line CBL at the other input/output terminal.

The gate of the PMOS transistor forming the transfer gate switch 162 is connected to an output of the inverter IV162 and the gate of the NMOS transistor and an input of the inverter IV162 are connected to a supply line of the column select signal SCL<1>.

(Description of Write Operation)

Given that the plate voltage VPLATE on standby is 0 V, then the plate voltage VPLATE rises to high-level (H) potential first.

In this instance, potentials of both the bit lines LBL<1:0> are inconstant. Herein, descriptions will be given to a state where the drive enable signal DRVE is fixed at a high level (H) in the operating waveform charts.

Subsequently, the gate voltage (the dummy word line DWL) of the access transistor AT forming the dummy memory cell DCEL is maintained at a high level (H) for a certain period. Accordingly, all the bit lines LBL have the same potential as that of the plate voltage VPLATE via the dummy memory cell.

The column select signal CSL and the word line WL are activated after the dummy word line DWL has risen up.

In this instance, the bit line LBL<1> is in a floating state while maintaining the VPLATE potential whereas the bit line LBL<0> is connected to the column bit line CBL because the column select signal CSL has resin to a high level (H). Consequently, the bit line LBL<0> is driven to be at the VDD level via the column bit line CBL.

Subsequently, a pulse is applied to the column bit line CBL by applying the data pulse DIN, so that a pulse is applied to the bit line LBL<0>. In this instance, a voltage is applied to the bit line LBL<0> from the plate voltage supply line LVPLATE. A write operation is thus performed.

Because the non-selected bit line LBL<1> remains in a floating state while being pre-charted to the VPLATE potential in this instance, even when the word line WL comes ON, no voltage is applied because there is no potential difference between LVPLATE and LBL.

In short, a disturb will not occur.

Because an erase operation is substantially the same as the write operation, descriptions are omitted herein. It should be appreciated, however, that the occurrence of a disturb can be avoided by the configuration described above.

The circuit configuration described above is advantageous in that it can be suitably used for miniaturization owing to its miniature layout configuration made possible by the column switch that can be formed of the smallest transistors and further the pre-charge element that can be formed in the same pattern as the memory element (the resistor element is omitted).

2. Second Embodiment

Figure 22:
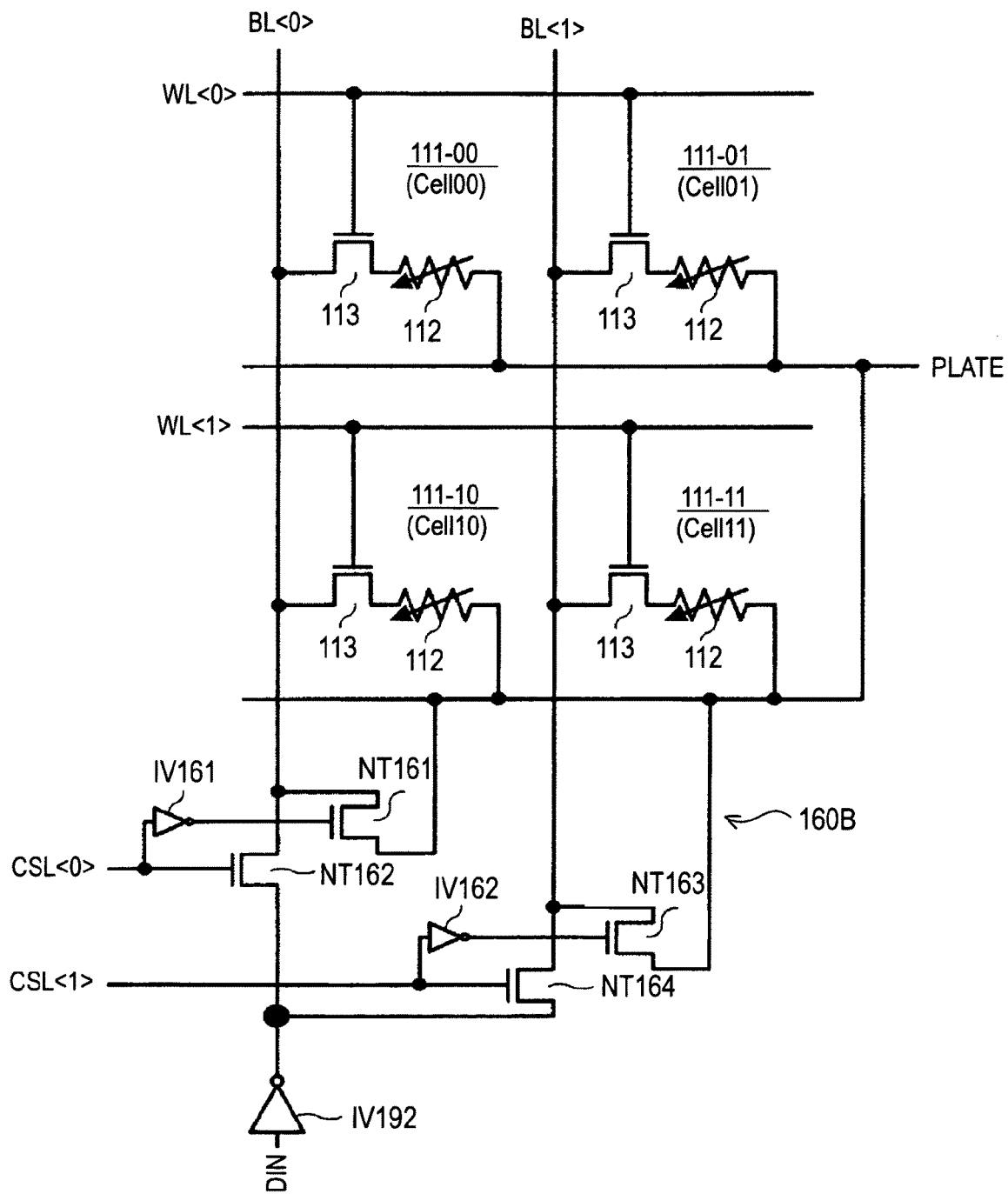
FIG. 22 is a circuit diagram showing a potential control system of a non-selected bit line according to an embodiment of the present invention.

FIG. 22 is a circuit diagram showing a potential control system of a non-selected bit line according to another embodiment of the present invention.

FIG. 23A through FIG. 23H are operating waveform charts of the circuit of FIG. 22 during an erase operation.

Figure 23:
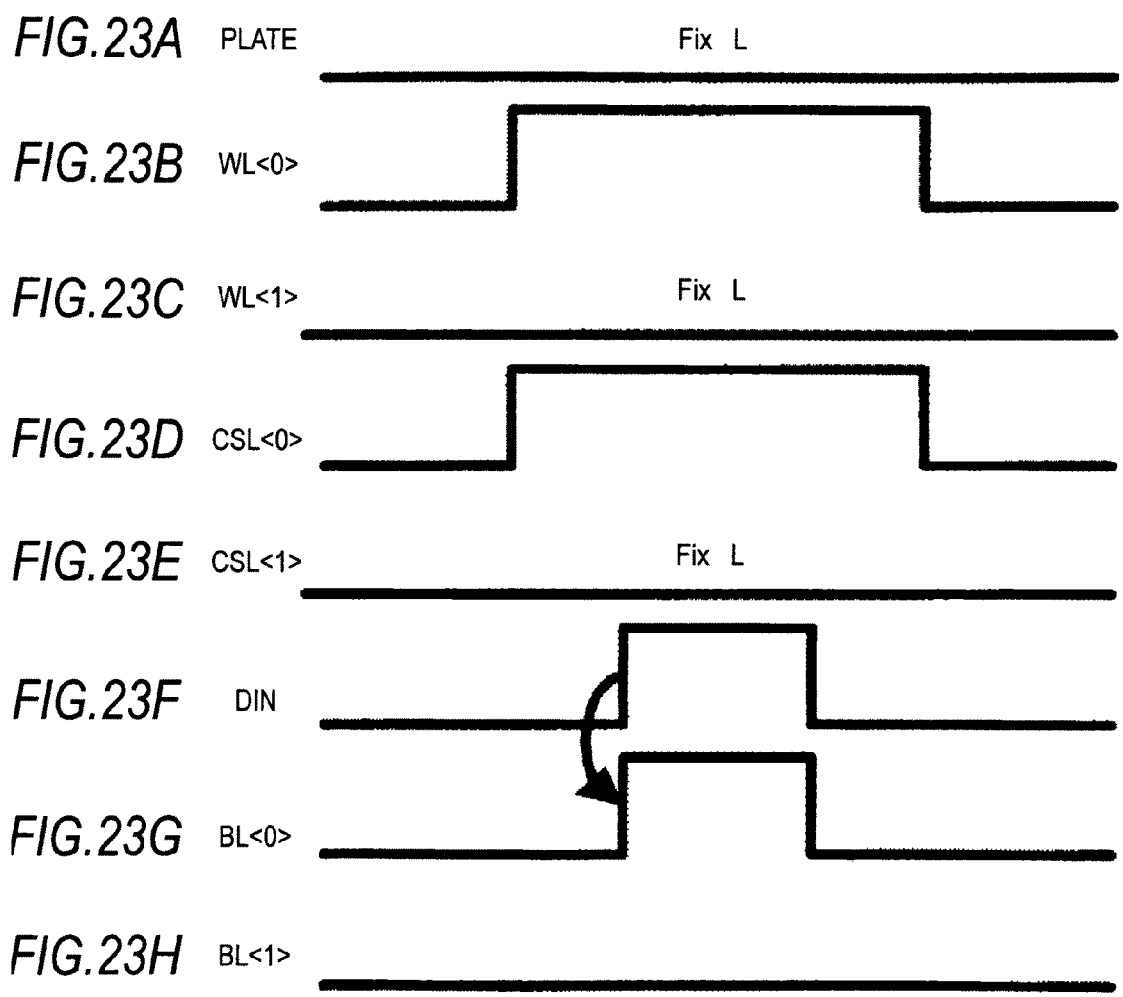
FIG. 23A through FIG. 23H are operating waveform charts of the circuit of FIG. 22 during a write operation.

FIG. 23A shows the potential of the plate voltage VPLATE. FIG. 23B shows the potential of the word line WL<0>. FIG. 23C shows the potential of the word line WL<1>.

FIG. 23D shows the level of the column select signal SCL<0>. FIG. 23E shows the level of the column select signal SCL<1>. FIG. 23F shows the level of data DIN. FIG. 23G shows the level of the bit line BL<0>. FIG. 23H shows the level of the bit line BL<1>.

The potential control system of a non-selected bit line of this embodiment is different from the potential control system of a non-selected bit line of FIG. 19 in that the plate voltage supply line LVPLATE is connected to the respective bit lines BL<0> and BL<1> during a pre-charge without using the dummy memory cells.

This embodiment includes a signal control method by which a control signal that actives a pre-charge is activated for a certain period before read, write, and erase pulses are applied to the memory cell bit line subject to read, write, and erase operations, so that each is activated by the non-overlap logic.

To be more concrete, the configuration of a column switch 160B is different from the configuration of FIG. 19.

The column switch 160B has NMOS transistors NT161 through NT164 instead of the transfer gates switches 161 and 162.

The source and the drain of the NMOS transistor NT161 serving as a pre-charge switch are connected to the plate voltage supply line LVPLATE and the bit line BL<0>, respectively, and the gate thereof is connected to an output of the inverter IV161.

The source and the drain of the NMOS transistor NT162 serving as a column switch are connected to the bit line BL<0> and the column bit line CBL, respectively.

The gate of the NMOS transistor NT162 and an input of the inverter IV161 are connected to a supply line of the column select signal CSL<0>.

The source and the drain of the NMOS transistor NT163 serving as a pre-charge switch are connected to the plate voltage supply line LVPLATE and the bit line BL<1>, respectively, and the gate thereof is connected to an output of the inverter IV162.

The source and the drain of the NMOS transistor NT164 serving as a column switch are connected to the bit line BL<1> and the column bit line CBL, respectively.

The gate of the NMOS transistor NT164 and an input of the inverter IV162 are connected to a supply line of the column select signal CSL<1>.

(Description of Erase Operation)

The plate voltage VPLATE is fixed to 0 V during an erase operation.

Initially, because the column select signals CSL<0> and CSL<1> are at a low level, the outputs of the inverters IV161 and IV162 become a high level, which turns ON the NMOS transistors NT161 and NT163.

Consequently, the plate voltage supply line LVPLATE is connected to the respective bit lines BL<0> and BL<1> and the bit lines BL<0> and BL<1> are pre-charged to 0 V.

The column select signal CSL<0> and the word line WL<0> are then activated.

In this instance, the bit line BL<1> is in a state where it is maintained at 0 V potential.

Subsequently, a pulse is applied to the column bit line CBL by applying the data pulse DIN, so that a pulse is applied to the bit line LBL<0>.

An erase operation is thus performed.

In this instance, because the non-selected bit line BL<1> is kept pre-charged to 0 V, even when the word line WL comes ON, no voltage is applied because there is no potential difference between LVPLATE and BL.

In short, a disturb will not occur.

Because a write operation is substantially the same as the erase operation, descriptions are omitted herein. It should be appreciated, however, that the occurrence of a disturb can be avoided by the configuration describe above.

The circuit configuration described above is advantageous in that it can be suitably used for miniaturization owing to its miniature layout configuration made possible by the column switch that can be formed of the smallest transistors and further the pre-charge element that can be formed in the same pattern as the memory element (the resistor element is omitted).

Further, different from the first embodiment above, a voltage is applied to the non-selected bit lines BL instead of performing the floating control in this embodiment. Hence, the circuit configuration is also advantageous in that that the stability is relatively high.

3. Third Embodiment

Figure 24:
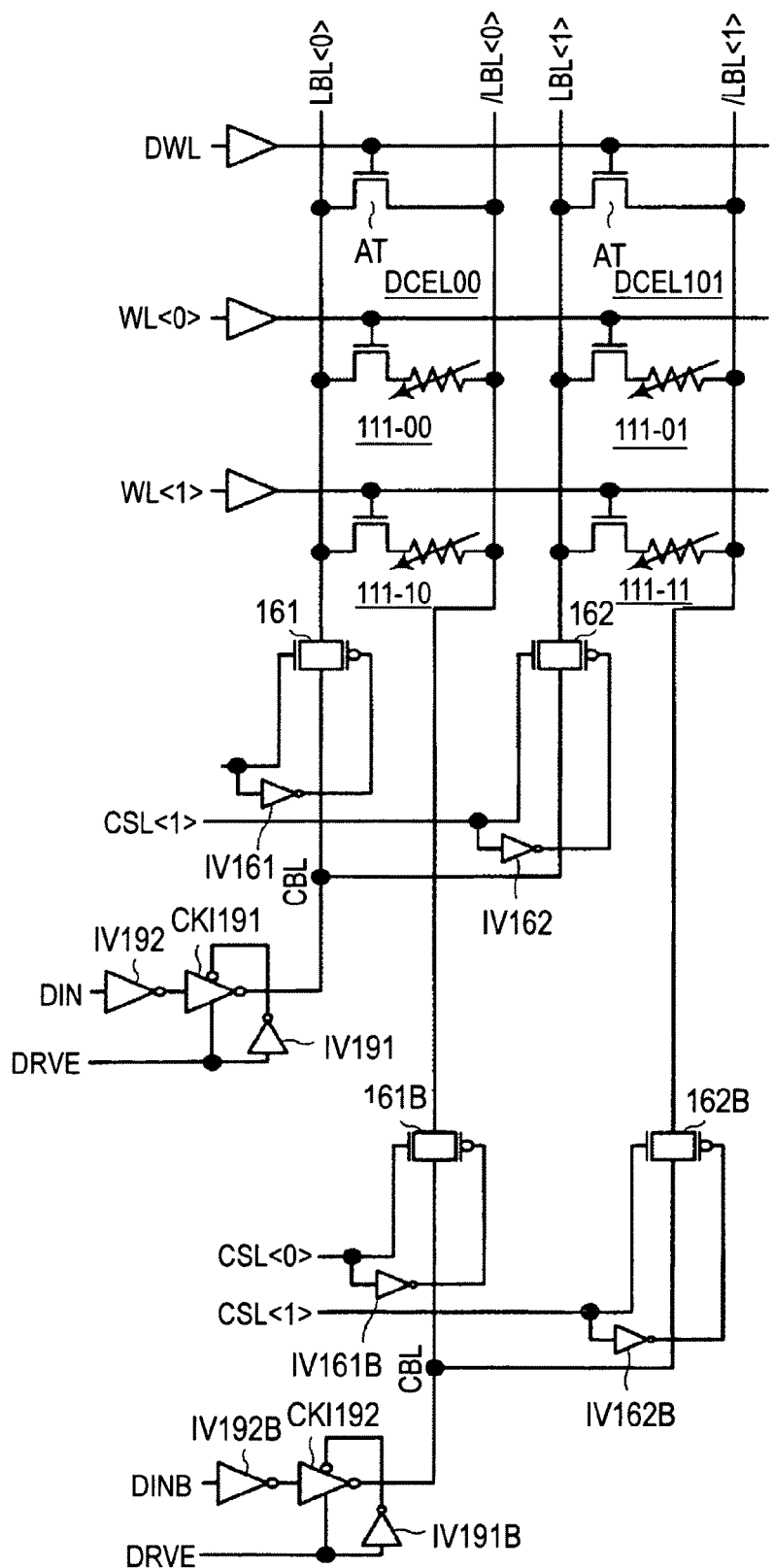
FIG. 24 is a circuit diagram showing a potential control system of non-selected bit lines according to an embodiment of the present invention.

FIG. 24 is a circuit diagram showing a potential control system of non-selected bit lines of still another embodiment of the present invention.

FIG. 25A through FIG. 25K are charts showing operating waveforms of the circuit shown in FIG. 24 during a write operation.

FIG. 25A shows the potential of the dummy word line DWL. FIG. 25B shows the level of data DIN. FIG. 25C shows the level of inverting data DINB. FIG. 25D shows the level of the column bit line CBL.

FIG. 25E shows the potential of the word line WL<0>. FIG. 25F shows the level of the column select signal SCL<0>. FIG. 25G shows the level of the bit line LBL<0>. FIG. 25H shows the level of the inverting bit line/LBL.

FIG. 25I shows the level of the column select signal SCL<1>. FIG. 25J shows the level of the bit line LBL<1>. FIG. 25K shows the level of the inverting bit line/LBL<1>.

The potential control system of non-selected bit lines of this embodiment is different from the potential control system of a non-selected bit line of FIG. 19 in that a so-called folded bit line method is adopted.

More specifically, this embodiment does not adopt the configuration to share the plate voltage supply line LVPLATE by a plurality of memory cells but it is an example where the present invention is applied to an array configuration of bit lines LBL and inverting bit lines/LBL.

In this embodiment, the non-selected bit lines LBL are equalized to the same potential while remaining in a floating state by turning ON the dummy word line DWL using a pair of the bit line LBL and the inverting bit line/LBL. A disturb is thus avoided.

In the example of FIG. 24, for example, the inverting bit line/LBL corresponds to a plate line (plate voltage supply line).

According to this embodiment, it is possible to obtain the advantages same as those of the first embodiment above.

The present application contains subject matter related to that disclosed in Japanese Priority Patent Application JP 2008-313615 filed in the Japan Patent Office on Dec. 9, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a memory cell array having a plurality of memory cells arranged in arrays;
    a plurality of bit lines configured in columns of the memory cells;
    a plurality of word lines configured in rows of the memory cells;
    a plate line having one of a configuration in which first electrodes of the plurality of memory cells are included in the plate line and a configuration in which the first electrodes are connected to the plate line;
    a column switch configured to connect a selected bit line and a data access line; and a pre-charge portion configured to perform a pre-charge operation to pre-charge a non-selected bit line not selected by the column switch to a potential of the plate line, wherein each of the plurality of memory cells includes a memory element including a memory layer sandwiched between the first electrode and a second electrode and having a resistance value that varies with an application of a voltage between the first electrode having one of a configuration to be included in the plate line and a configuration to be connected to the plate line and the second electrode, and an access transistor connected between the second electrode and one of the plurality of bit lines provided in a corresponding column and having a gate connected to one of the plurality of word lines provided in a corresponding row.

2. The semiconductor device according to claim 1, wherein the pre-charge portion is configured to perform the pre-charge operation during at least one of a write operation and an erase operation with one of the plurality of memory cells.

3. The semiconductor device according to claim 2, wherein the pre-charge portion is capable of making a selection as to whether the pre-charge operation is to be performed during at least one of the write operation and the erase operation with one of the plurality of memory cells.

4. The semiconductor device according to claim 2, wherein the pre-charge portion is capable of maintaining a bit line voltage by turning OFF a pre-charge function during at least one of the write operation and the erase operation with one of the plurality of memory cells.

5. The semiconductor device according to claim 1, wherein the pre-charge portion has a plurality of dummy memory cells provided in respective rows of the memory cell array;

each dummy memory cell includes an access transistor equivalent to the access transistor of the memory cell;

the access transistor is connected between the plate line and a corresponding bit line and a gate thereof is connected to a dummy word line; and the access transistor is maintained in an ON state by the dummy word line during the pre-charge operation.

6. The semiconductor device according to claim 5, wherein the dummy memory cell is configured in such a manner that a first electrode and a second electrode are connected directly by omitting the memory layer interposed between the first electrode and the second electrode in a portion of the memory element of the memory cell.

7. The semiconductor device according to claim 1, wherein the pre-charge portion includes a switching transistor configured to connect the plate line and a corresponding column bit line when a column select signal is at a non-selection level.

* * * * *